(12) United States Patent
Yang et al.

(10) Patent No.: US 7,765,458 B1
(45) Date of Patent: Jul. 27, 2010

(54) ERROR PATTERN GENERATION FOR TRELLIS-BASED DETECTION AND/OR DECODING

(75) Inventors: Shaohua Yang, San Jose, CA (US); Seo-How Low, San Jose, CA (US); Zining Wu, Los Altos, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 963 days.

(21) Appl. No.: 11/518,020

(22) Filed: Sep. 8, 2006

Related U.S. Application Data

(60) Provisional application No. 60/721,663, filed on Sep. 29, 2005, provisional application No. 60/725,510, filed on Oct. 10, 2005, provisional application No. 60/729,921, filed on Oct. 25, 2005, provisional application No. 60/799,958, filed on May 12, 2006.

(51) Int. Cl.
*H03M 13/41* (2006.01)
(52) U.S. Cl. .................................................. 714/795
(58) Field of Classification Search ................ 714/792, 714/794, 795; 712/792, 794, 795
See application file for complete search history.

(56) References Cited

U.S. PATENT DOCUMENTS

| 7,012,974 B1 * | 3/2006 | Liu et al. ..................... 375/340 |
| 7,089,483 B2 * | 8/2006 | McEwen et al. ............. 714/795 |
| 7,155,660 B1 * | 12/2006 | Burd .......................... 714/795 |
| 7,571,372 B1 * | 8/2009 | Burd et al. .................. 714/769 |

OTHER PUBLICATIONS

Seshadri, N., et al., "List Viterbi Decoding Algorithms with Applications", IEEE Transactions on Communications, vol. 42, No. 2/3/4, Feb./Mar./Apr. 1994, pp. 313-323.*

Roy D. Cideciyan et al. "Noise Predictive Maximum Likelihood Detection Combined with Parity-Based Post-Processing", IEEE Transactions on Magnetics, vol. 37, pp. 714-720: (2001).

Joachim Hagenauer et al. "A Viterbi Algorithm with Soft-Decision Outputs and its Applications", German Aerospace Research Establishment, pp. 1680-1686 (1989).

Olaf J. Joeressen et al, "High-Speed VLSI Architectures for Soft-Output Viterbi Decoding", Journal of VLSI Signal Processing, vol. 8, pp. 169-181: (1994).

Wu Zining, "Coding and Iterative Detection for Magnetic Recording Channels, ISBN 0 7923-7717-6, Jan. 2000, Kluwer : Boston", pp. 108-113 (1994).

Berrou C. et al., "A Low Complexity Soft-Output Viterbi Decoder Architecture," Proceedings of the International Conference on Communications, May 1993, IEEE, US, vol. 3, pp. 737-740.

Luthi E. et al., "High Rate Soft Output Viterbi Decoder,", PROC. European Design and Test Conference, Mar. 1991, pp. 315-319.

J. Hagenauer, "Source-Controlled Channel Decoding," IEEE Transactions on Communications, vol. 43, No. 9, Sep. 1, 1995, pp. 2452-2453.

* cited by examiner

*Primary Examiner*—Stephen M Baker

(57) ABSTRACT

The disclosed technology provides systems and methods for identifying potential error locations, patterns, and likelihood metrics in connection with trellis-based detection/decoding. In one aspect of the invention, the disclosed technology detects information that was previously encoded based on a trellis, and decodes the detected information based on the trellis to provide decoded information. The decoded information corresponds to a winning path through the trellis that ends at a winning state. The disclosed technology can identify one or more alternate paths through the trellis that also end at the winning state, and can generate a potential error pattern for each of the alternate paths.

36 Claims, 22 Drawing Sheets

US 7,765,458 B1
ERROR PATTERN GENERATION FOR TRELLIS-BASED DETECTION AND/OR DECODING

CROSS-REFERENCE TO RELATED APPLICATIONS

This application claims the benefit under 35 U.S.C. §119 (e) of U.S. Provisional Application Nos. 60/721,663, filed Sep. 29, 2005, 60/725,510, filed Oct. 10, 2005, 60/729,921, filed Oct. 25, 2005, and 60/799,958, filed May 12, 2006, which are hereby incorporated herein by reference in their entirety.

BACKGROUND OF THE INVENTION

This invention relates to identifying most likely errors in a communication signal and, more particularly, to identifying potential error locations, patterns, and likelihood metrics in connection with trellis-based detection and/or decoding. This invention also relates to computing soft reliability information for each detected/decoded bit or codeword syndrome value.

Consider a system that can be represented by a finite state machine. For example, a finite state machine can be used to model an inter-symbol-interference (ISI) channel or a convolutional code encoder. A trellis diagram can be used to represent the sequence of all possible paths (i.e., sequences of states) that the system can visit over time. If the system can transition from state A at time t to state B at time t+1, then these states are connected by a branch. Each branch may be labeled by X/Y pair, where X denotes the input that causes the system to transition from state A to B and Y represents an output corresponding to this transition. For example, an ISI channel with a two-bit channel response can be represented by a four-state trellis diagram. The states of this trellis can be labeled as 00, 01, 10, 11 and may be associated with the latest two bits transmitted through the ISI channel. For example, if the system is at state 01 at time t, and 0 is transmitted, then the next state at time t+1 would be 10. Similarly, the system would transition to state 11 if 1 were transmitted. Channel output Y that results from these transitions is a real number m, that may be different for each branch.

In the convolutional encoding situation, an encoder receives input bits and generates output bits that are weighted sums of the input bits.

In the case of an ISI channel, the number of output signals will be usually the same as the number of input signals. In contrast, a convolutional encoder generally does introduce additional output bits, such that there may be two bits at the output of a convolutional encoder for each input bit, for example.

In the ISI channel situation, the signals at the output of the ISI channel are detected by a trellis-based detector, such as a Viterbi (maximum-likelihood) detector. In the convolutional encoder situation, the bits at the output of the encoder (also called "parity bits") are communicated to a receiver and are decoded using a Viterbi decoder. In either situation, the detector/decoder is based on the trellis representing the ISI channel or the convolutional encoder. However, a Viterbi detector/decoder does not know the particular path that occurred in the trellis of the ISI channel/convolutional encoder. Rather, the Viterbi detector/decoder must use the signals/bits it receives and find the trellis path that most-likely occurred based on the received signals/bits. This detection/decoding is often complicated by the presence of noise or errors in the received signals/bits. In some situations, the trellis path that most-likely occurred based on the received signals/bits may not be the same as the trellis path that actually occurred in the ISI channel/convolutional encoder. In such situations, another layer of error-correction may be applied before the ISI channel/convolutional encoding, so that any errors that may remain after Viterbi detection/decoding can be addressed. In this case, it may be helpful to determine the potential location and nature of these errors and to provide this information to the additional layer of error-correction for its consideration.

SUMMARY OF THE INVENTION

The disclosed technology provides systems and methods for identifying potential error locations, patterns, and likelihood metrics in connection with trellis-based detection/decoding. The disclosed technology also provides soft reliability information for detected/decoded bits.

In accordance with one aspect of the invention, the disclosed technology detects information that was previously encoded based on a trellis, and decodes the detected information based on the trellis to provide decoded information. The decoded information corresponds to a winning path through the trellis that ends at a winning state. The disclosed technology can identify at least one alternate path through the trellis that also ends at the winning state, and can generate a potential error pattern for each of the alternate paths.

In accordance with one aspect of the invention, the disclosed technology can identify at least one alternate path by first determining a trace back depth associated with the at least one alternate path. Then, starting from the winning state, the disclosed technology can trace back paths through the trellis for a number of trellis stages, wherein the number of trellis stages is based on the trace back depth. The resulting stage is referred to herein as a "boundary stage." The paths covered during the tracing back operation correspond to the trace back portion of the alternate paths. The non-trace back portion of the alternate paths correspond to the winning paths from the initial state of the trellis to the states in the boundary stage. In one embodiment, the winning path can reach the winning state through a particular branch connected to the winning state, and the tracing back can occur by tracing back through branches other than that particular branch.

In accordance with one aspect of the invention, the disclosed technology can eliminate certain alternate paths from being used to generate error patterns. In one embodiment, the disclosed technology can associate each alternate path with a metric and can eliminate alternate paths whose metrics exceed a threshold value. In one embodiment, the disclosed technology can generate a potential error pattern for each alternate path, identify error patterns of interest from among the potential error patterns, and keep only the error patterns of interest. The disclosed technology can associate a likelihood metric for each of the error patterns of interest to indicate its likelihood of occurring. In one embodiment, the likelihood metric can be based on a path metric difference. In one embodiment, the disclosed technology can eliminate alternate paths that include more than a predetermined number of losing branches. As used herein, a losing branch refers to a branch entering a state that is not the winning branch entering the state.

In accordance with one aspect of the invention, the disclosed technology can assign metrics to each branch entering a particular state. The disclosed technology can assign a metric value of zero to a winning branch and a path metric difference to a losing branch.

As described above, the trellis includes a boundary stage that is based on a trace back depth, and the boundary stage includes trellis states. In accordance with one aspect of the invention, the disclosed technology can determine winning paths from an initial state in the trellis to each of the trellis states in the boundary stage. Each of the winning paths can correspond to user information, and this user information can be stored in a memory. The user information for a winning path to a particular trellis state can be associated with that state, and is sometimes referred as the path memory associated with that state. In some embodiments, only the user information for the most recent segment of the paths is stored due to memory limitation.

The disclosed technology provides decoded information based on the trellis as described above. The disclosed technology can provide a potential error pattern for the alternate path by computing a difference between the decoded information and the user information corresponding to the alternate path. Using the stored user information, the disclosed technology can save time and resources in generating the user information for the alternate path. In particular, the user information for the non-trace back portion of the alternate path can simply be retrieved from the memory. The user information for the trace back portion of the alternate path can be determined based on the trellis.

In accordance with one aspect of the invention, the disclosed technology can identify error patterns that have an odd parity error syndrome within the boundaries of the parity-coded code word. In one embodiment, the disclosed technology can associate likelihood metrics with the error patterns and can identify the error pattern having the lowest likelihood metric from among the error patterns having an odd parity error syndrome. If the decoded information has an odd parity error syndrome, then the disclosed system can alter the decoded information using the identified error pattern. In some embodiments, where an error pattern has multiple bits and some of the bits are outside of the code word boundaries, the outside portion of the error pattern will not contribute to the parity error syndrome correction unless the outside portion will not alter the parity of the adjacent codeword syndrome.

In accordance with one aspect of the invention, the disclosed technology can store error patterns instead of the user information for most likely paths from an initial state in the trellis to the states in the boundary stage. Each error pattern can be associated with the particular trellis state in the boundary stage to which the winning paths connect. The stored error pattern associated with a trellis state in the boundary stage indicates the difference between the user information associated with that boundary state and a non-trace back portion of the decoded information. This non-trace back portion of the error pattern can be stored in a memory. In some embodiments, only the error patterns for the most recent segment of the paths are stored due to memory limitation.

The disclosed technology can use the stored error pattern portions to generate error patterns for each of the alternate paths. In particular, the disclosed technology can provide a non-trace back portion of a potential error pattern by simply retrieving it from the memory. For the trace back portion, the disclosed technology can determine user information for that portion of the alternative path. The trace back portion of the potential error pattern can be generated by computing a difference between: a trace back portion of the decoded information, and the user information for the trace back portion of the alternate path.

In one embodiment, the disclosed technology can also compute a single parity check (SPC) syndrome based on the stored non-trace back portion of the error pattern, and can store the SPC syndrome in the memory together with the error pattern. Using this stored SPC syndrome, a SPC syndrome for an entire error pattern can be generated more efficiently. The disclosed technology can simply retrieve the SPC syndrome from the memory, and compute the SPC syndrome for the entire error pattern based on the retrieved SPC syndrome and the trace back portion of the error pattern. If the SPC syndrome for the decoded information is odd, the disclosed technology can alter the decoded information using the error pattern with odd syndrome. An associated error event metric indicates the reliability of the parity correction. In some embodiments, a large metric indicates that the error event is not likely.

In accordance with one aspect of the invention, the disclosed system can include a detector means for detecting information that was previously encoded based on a trellis, and a decoder means for decoding the detected information based on the trellis to provide decoded information. The decoded information corresponds to a winning path through the trellis that ends at a winning state. An error event generator means can include means for identifying at least one alternate path through the trellis that also ends at the winning state, and means for generating a potential error pattern for each of the alternate paths.

In accordance with one aspect of the invention, the error event generator means can include means for identifying at least one alternate path by first determining a trace back depth associated with the predetermined number of alternate paths. The error event generator means can include means for tracing back paths through the trellis, starting from the winning state, for a number of trellis stages, wherein the number of trellis stages is based on the trace back depth. The resulting stage is referred to herein as a "boundary stage." The paths covered during the tracing back operation correspond to the trace back portion of the alternate paths. The non-trace back portion of the alternate paths correspond to the winning paths from the initial state of the trellis to the states in the boundary stage. In one embodiment, the winning path can reach the winning state through a particular branch connected to the winning state, and the tracing back can occur by tracing back through branches other than that particular branch.

In accordance with one aspect of the invention, the error event generator means can include means for eliminating certain alternate paths from being used to generate error patterns. In one embodiment, the error event generator means can include means for associating each alternate path with a metric and means for eliminating alternate paths whose metrics exceed a threshold value. In one embodiment, the error event generator means can include means for generating a potential error pattern for each alternate path, means for identifying error patterns of interest from among the potential error patterns, and means for keeping only the error patterns of interest. The error event generator means can include means for associating a likelihood metric for each of the error patterns of interest to indicate its likelihood of occurring. In one embodiment, the likelihood metric can be based on a path metric difference. In one embodiment, the error event generator means can include means for eliminating alternate paths that include more than a predetermined number of losing branches. As used herein, a losing branch refers to a branch entering a state that is not the winning branch entering the state.

In accordance with one aspect of the invention, the error event generator means can include means for assigning metrics to each branch entering a particular state. The alternate path processor means can include means for assigning a metric value of zero to a winning branch and a path metric difference to a losing branch.

As described above, the trellis includes a boundary stage that is based on a trace back depth, and the boundary stage includes trellis states. In accordance with one aspect of the invention, the error event generator means can include means for determining winning paths from an initial state in the trellis to each of the trellis states in the boundary stage. Each of the winning paths can correspond to user information, and this user information can be stored in a memory. The error event generator means can include means for associating the user information for a winning path to a particular trellis state with that state.

The decoder means can provide decoded information based on the trellis as described above. The error event generator means can include means for providing a potential error pattern for the alternate path by computing a difference between the decoded information and the user information corresponding to the alternate path. Using the stored user information, the error event generator means can save time and resources in generating the user information for the alternate path. In particular, the user information for the non-trace back portion of the alternate path can simply be retrieved from the memory. The error event generator means can include means for determining the user information for the trace back portion of the alternate path based on the trellis.

In accordance with one aspect of the invention, the error event generator means can include means for identifying error patterns that have an odd parity error syndrome within the boundaries of the parity-coded code word. In one embodiment, the error event generator means can include means for associating likelihood metrics with the error patterns and circuitry that identifies the error pattern having the lowest likelihood metric from among the error patterns that having an odd parity error syndrome. The error event generator means can include means for altering the decoded information using the identified error pattern if the decoded information also has an odd parity error syndrome. In some embodiments, where an error pattern has multiple bits and some of the bits are outside of the code word boundaries, the outside portion of the error pattern will not contribute to the means for parity error syndrome correction unless the outside portion does not alter the parity syndrome of the adjacent code word.

In accordance with one aspect of the invention, the error event generator means can include means for storing error patterns for most likely paths from an initial state in the trellis to the states in the boundary stage. In some embodiments, only the error patterns for the most recent segment of the paths are stored. In particular, the error event generator means can include means for determining user information corresponding to each of the alternate paths, and means for computing a difference between the user information and a non-trace back portion of the decoded information. This non-trace back portion of the error pattern can be stored in a memory. The error event generator means can include means for associating each error pattern with the particular trellis state in the boundary stage to which the winning paths connect.

The error event generator means can include means for using the stored error pattern portions to generate error patterns for each of the alternate paths. In particular, the error event generator means can include means for providing a non-trace back portion of a potential error pattern by simply retrieving it from the memory. For the trace back portion, the error event generator means can include means for determining user information for that portion of the alternate path, means for generating the trace back portion of the potential error pattern by computing a difference between: a trace back portion of the decoded information, and the user information for the trace back portion of the alternate path.

In one embodiment, the error event generator means can include means for computing a SPC syndrome based on the stored non-trace back portion of the error pattern, and means for storing the SPC syndrome in the memory together with the error pattern. The error event generator means can include means for using this stored SPC syndrome to more efficiently generate a SPC syndrome for an entire error pattern. The error event generator means can include means for retrieving the SPC syndrome from the memory, and means for computing the SPC syndrome for the entire error pattern based on the retrieved SPC syndrome and the trace back portion of the error pattern. The error event generator means can include means for altering the decoded information using the error pattern if the SPC syndrome for the decoded information and the error pattern are both odd. An associated error event metric indicates the reliability of the parity correction. In some embodiments, a large metric indicates that the error event is not likely.

In accordance with one aspect of the invention, a computer program executing on a processor can perform the steps of receiving detected information that was previously encoded based on a trellis, and decoding the detected information based on the trellis to provide decoded information. The decoded information corresponds to a winning path through the trellis that ends at a winning state. A computer program executing on a processor can perform the steps of identifying at least one alternate path through the trellis that also ends at the winning state, and generating a potential error pattern for each of the alternate paths.

In accordance with one aspect of the invention, a computer program executing on a processor can perform the step of identifying at least one alternate path by first determining a trace back depth associated with the predetermined number of alternate paths. A computer program executing on a processor can perform the step of tracing back paths through the trellis, starting from the winning state, for a number of trellis stages, wherein the number of trellis stages is based on the trace back depth. The resulting stage is referred to herein as a "boundary stage." The paths covered during the tracing back operation correspond to the trace back portion of the alternate paths. The non-trace back portion of the alternate paths correspond to the winning paths from the initial state of the trellis to the states in the boundary stage. In one embodiment, the winning path can reach the winning state through a particular branch connected to the winning state, and the tracing back can occur by tracing back through branches other than that particular branch.

In accordance with one aspect of the invention, a computer program executing on a processor can perform the step of eliminating certain alternate paths from being used to generate error patterns. In one embodiment, a computer program executing on a processor can perform the step of associating each alternate path with a metric and circuitry that eliminates alternate paths whose metrics exceed a threshold value. In one embodiment, a computer program executing on a processor can perform the step of generating a potential error pattern for each alternate path, identifying error patterns of interest from among the potential error patterns, and keeping only the error patterns of interest. A computer program executing on a processor can perform the step of associating a likelihood metric for each of the error patterns of interest to indicate its likelihood of occurring. In one embodiment, the likelihood metric can be based on a path metric difference. In one embodiment, a computer program executing on a processor can perform the step of eliminating alternate paths that include more than a predetermined number of losing branches. As used herein, a losing branch refers to a branch entering a state that is not the winning branch entering the state.

In accordance with one aspect of the invention, a computer program executing on a processor can perform the step of assigning metrics to each branch entering a particular state. A computer program executing on a processor can perform the steps of assigning a metric value of zero to a winning branch and a path metric difference to a losing branch.

As described above, the trellis includes a boundary stage that is based on a trace back depth, and the boundary stage includes trellis states. In accordance with one aspect of the invention, a computer program executing on a processor can perform the step of determining winning paths from an initial state in the trellis to each of the trellis states in the boundary stage. Each of the winning paths can correspond to user information, and this user information can be stored in a memory. A computer program executing on a processor can perform the step of associating the user information for a winning path to a particular trellis state with that state.

The computer program can receive decoded information that was encoded based on a trellis as described above. A computer program executing on a processor can perform the step of providing a potential error pattern for the alternate path by computing a difference between the decoded information and the user information corresponding to the alternate path. Using the stored user information, a computer program can save time and resources in generating the user information for the alternate path. In particular, the user information for the non-trace back portion of the alternate path can simply be retrieved from the memory. A computer program executing on a processor can perform the step of determining the user information for the trace back portion of the alternate path based on the trellis.

In accordance with one aspect of the invention, a computer program executing on a processor can perform the step of identifying error patterns that have an odd parity error syndrome within the boundaries of the parity-coded code word. In one embodiment, a computer program executing on a processor can perform the steps of associating likelihood metrics with the error patterns and identifying the error pattern having the lowest likelihood metric from among the error patterns that having an odd parity error syndrome. A computer program executing on a processor can perform the step of altering the decoded information using the identified error pattern if the decoded information also includes an odd parity error syndrome. In some embodiments, where an error pattern has multiple bits and some of the bits are outside of the code word boundaries, the outside portion of the error pattern will not contribute to the parity error syndrome correction unless the outside portion of the error pattern does not alter the parity syndrome of the adjacent code word.

In accordance with one aspect of the invention, a computer program executing on a processor can perform the step of storing error patterns for most likely paths from an initial state in the trellis to the states in the boundary stage. In some embodiments, only the error patterns for the most recent segment of the paths are stored. In particular, a computer program executing on a processor can perform the steps of determining user information corresponding to each of the alternate paths, and computing a difference between the user information and a non-trace back portion of the decoded information. This non-trace back portion of the error pattern can be stored in a memory. A computer program executing on a processor can perform the step of associating each error pattern with the particular trellis state in the boundary stage to which the winning paths connect.

A computer program executing on a processor can perform the step of using the stored error pattern portions to generate error patterns for each of the alternate paths. In particular, a computer program executing on a processor can perform the step of providing a non-trace back portion of a potential error pattern by simply retrieving it from the memory. For the trace back portion, a computer program executing on a processor can perform the steps of determining user information for that portion of the alternate path, and generating the trace back portion of the potential error pattern by computing a difference between: a trace back portion of the decoded information, and the user information for the trace back portion of the alternate path.

In one embodiment, a computer program executing on a processor can perform the steps of computing a SPC syndrome based on the stored non-trace back portion of the error pattern, and storing the SPC syndrome in the memory together with the error pattern. A computer program executing on a processor can perform the step of using this stored SPC syndrome to more efficiently generate a SPC syndrome for an entire error pattern. A computer program executing on a processor can perform the steps of retrieving the SPC syndrome from the memory, and computing the SPC syndrome for the entire error pattern based on the retrieved SPC syndrome and the trace back portion of the error pattern. A computer program executing on a processor can perform the step of altering the decoded information using the error pattern if the SPC syndrome for the decoded information and the error pattern are both odd. An associated error event metric indicates the reliability of the parity correction. In some embodiments, a large metric indicates that the error event is not likely.

Further features of the invention, its nature and various advantages, will be more apparent from the accompanying drawings and the following detailed description of the various embodiments.

DETAILED DESCRIPTION

The disclosed technology provides systems and methods for identifying potential error locations, error patterns, and error likelihoods in connection with trellis-based detection/decoding. The disclosed technology also provides a system and method for computing soft reliability information for each detected/decoded bit or codeword syndrome value. As used herein, the term "information" will refer to binary digits that may be physically embodied in many ways that are known in the art. As used herein, in the case of convolutional encoding, information to be encoded will be referred to as "user information," and information produced by an encoder based on user information will be referred to as "parity information." User information may include information that has already been encoded by some type of encoder.

Figure 1A:
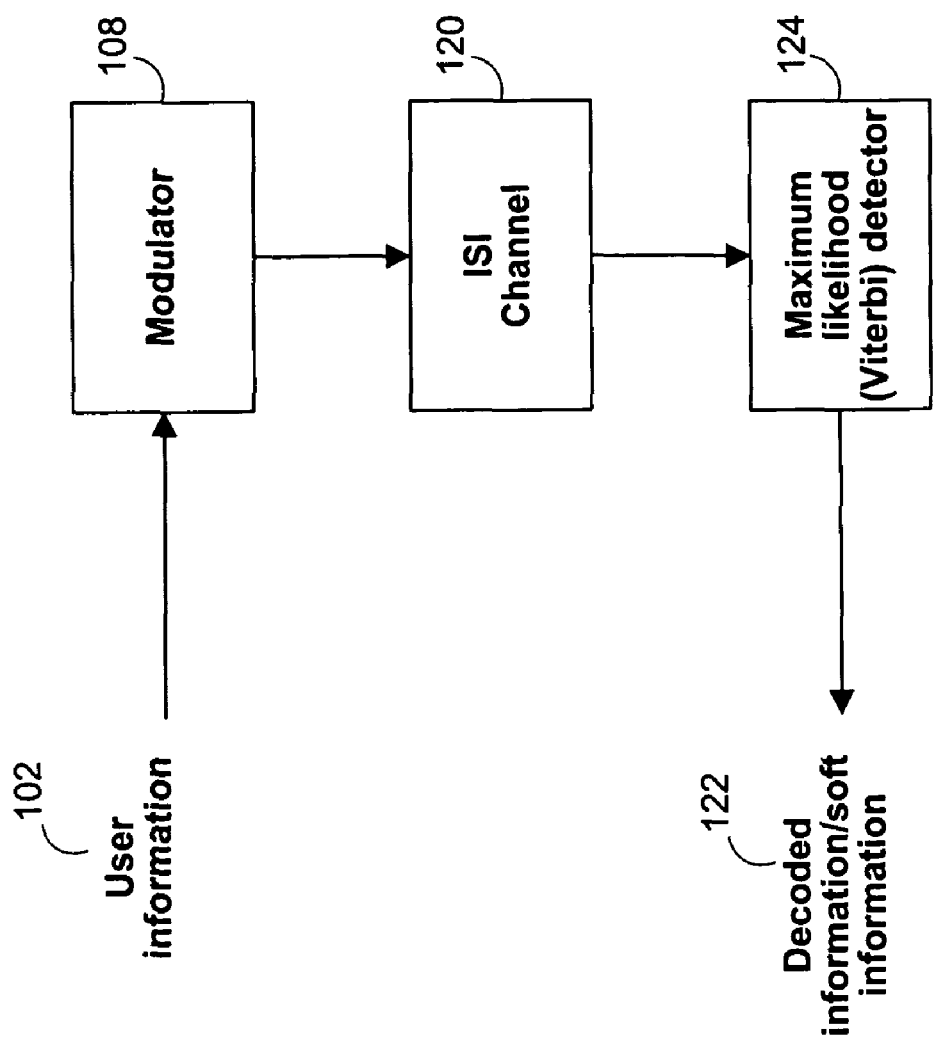
FIG. 1A is a block diagram of an exemplary system that includes an ISI channel.

Referring to FIG. 1A, there is shown an exemplary communication/storage system that includes an inter-symbol interference (ISI) channel 120. The system includes user information 102 that is intended for communication/storage. The user information 102 can be modulated by a modulator 108, which can perform electric-, magnetic-, or optical-based modulation, or another type of modulation. The modulator 108 transforms the user information into signals (not shown), which are received by the ISI channel 120. The signals at the output of the ISI channel 120 may be weighted sums of the signals received by the ISI channel 120. The Viterbi detector 124 receives the signals at the output of the ISI channel 120 and produces decoded information and/or soft information 122 based on the ISI channel's output signals (not shown). If there are no errors in the decoded information 122, the decoded information 122 will be the same as the user information 102.

Figure 1B:
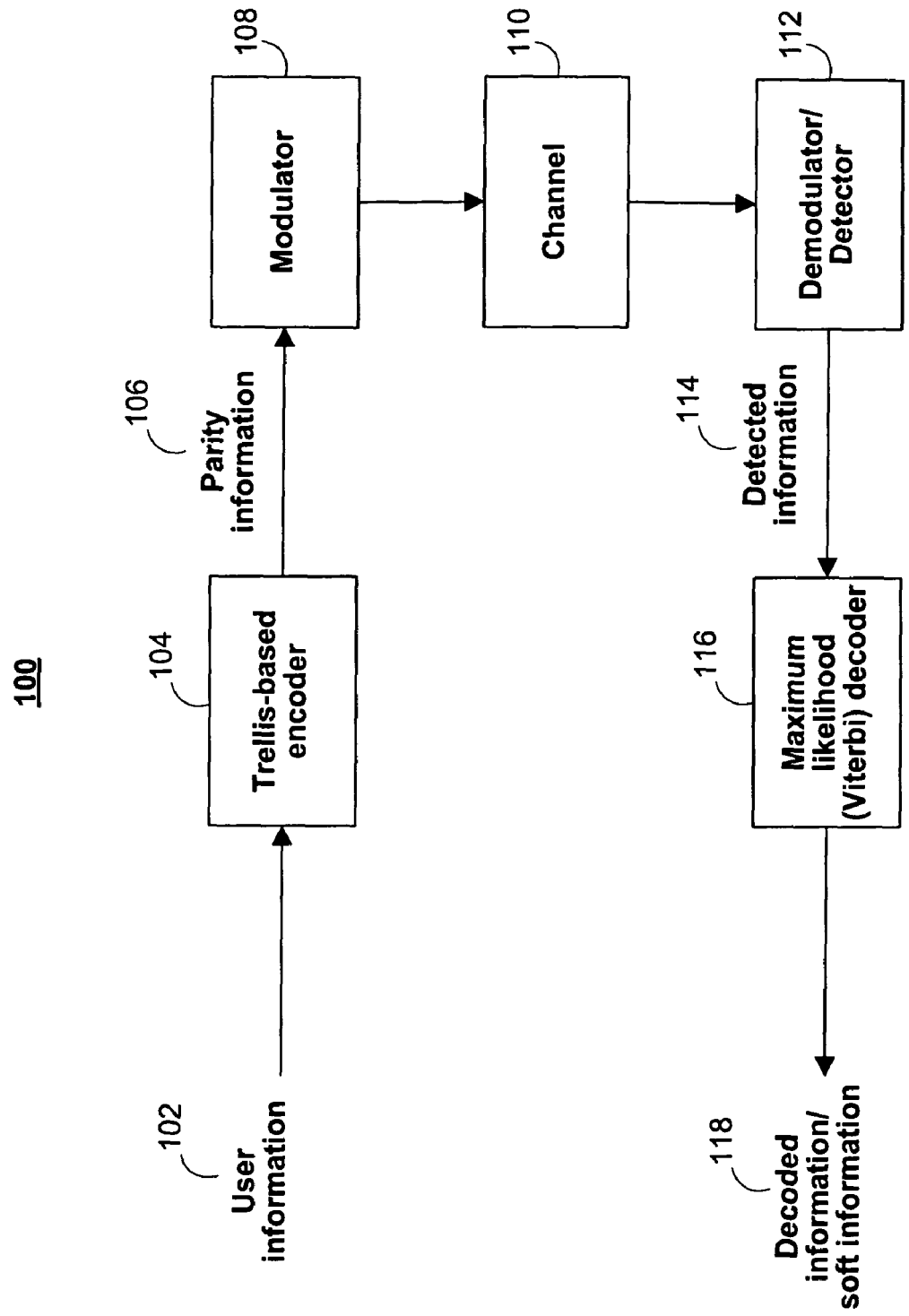
FIG. 1B is a block diagram of an exemplary system that uses a trellis-based code.

Referring now to FIG. 1B, there is shown an exemplary communication/storage system 100 that employs a trellis-based code. User information 102 that is intended for communication/storage can be encoded by a trellis-based encoder 104 to generate parity information 106. The trellis-based encoder 104 introduces additional information such that there will be a greater number of parity bits 106 than user bits 102.

In some embodiments, a portion of the parity information 106 may include the user information 102. In this case, the encoder is known as a "systematic" encoder. From this point on, for ease of explanation, it will be assumed that the trellis-based encoder 106 is not a systematic encoder. Therefore, the entire output of the trellis-based encoder 104 will be referred to as parity information/bits 106. However, it is contemplated that the disclosed invention applies to systematic encoders as well.

In the system of FIG. 1B, a modulator 108 configures the parity information 106 into a signal (not shown), which is passed to the channel 110. As used herein, the term "channel" refers to the media, devices, and/or processing stages that occur between a modulator 108 and a detector/demodulator 112 and can correspond to a particular path of media/devices through which a signal can flow, a particular wavelength or time slot which a signal can utilize, and/or another multiple access scheme. For example, in FIG. 1B, the channel 110 can correspond to storage and write and read components of a disk drive, including a magnetic storage medium, a disk-drive read/write head, and other storage system components. In some cases, the term "channel" as used herein can also include the modulator 108 and the demodulator/detector 112. While in the channel 110, the signal may encounter error-producing phenomena, such as device physical failure, device electrical failure, signal interference, and/or data loss due to buffer overflow, for example. The interference signals and other error-producing phenomena in a channel 110 will be referred to herein as "noise." As shown by the description above, the terms channel and noise are more conceptual than physical, but they correspond to physical aspects of a system. For ease of explanation, it will be assumed that the channel 110 of FIG. 1B is not an ISI channel. However, it is contemplated that the illustrated embodiment of FIG. 1B can include an ISI channel.

With continuing reference to FIG. 1B, the signal on the channel 110 can be received by a demodulator/detector 112. The demodulator/detector 112 can produce detected information 114 based on the received signal. If there are no errors in the detected information 114, the detected information should be the same as the parity information 106. If there are errors, however, the Viterbi decoder 116 may be able to correct some or all of the errors by virtue of the maximum-likelihood detection. If the Viterbi decoder 116 is able to correct all of the errors, the decoded information 118 will be the same as the user information 102. Otherwise, the decoded information 118 will be different from the user information 102. In this case, another layer of error-correction coding may be helpful, and one example will be described later herein in connection with FIG. 12. Those skilled in the art will recognize that various modulation/demodulation technologies can be used. Those skilled in the art will recognize that, in one embodiment, the trellis-based encoder 104 and the modulator 108 can be combined in a technology known as "trellis-coded modulation."

Figure 2:
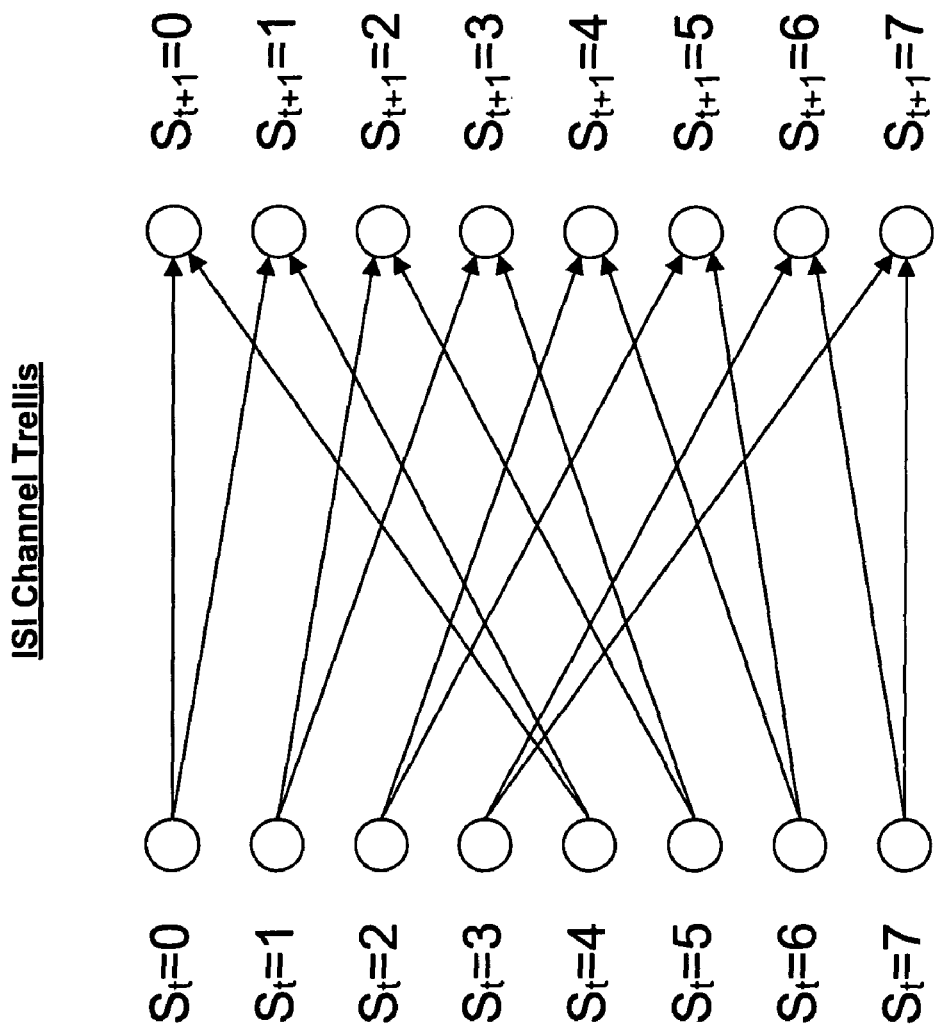
FIG. 2 is a diagram of an exemplary trellis state diagram corresponding to an ISI channel.

Referring now to the illustrated system of FIG. 1A, the operation of an ISI channel can be illustrated with reference to a channel input signal $x_t$, where t is the time index of the signal, and an exemplary trellis diagram shown in FIG. 2. In this example, the channel inputs are binary $x_t=+1$ or $-1$ and the equalized channel response (assuming a 4-tap target) will be $f=[f_0, f_1, f_2, f_3]$. The channel signal would then be $y_t=x_t*f_0+x_{t-1}*f_1+x_{t-2}*f_2+x_{t-3}*f_3+n_t$, where $n_t$ is the channel noise. Channel noise may also be uncorrelated in time, i.e., white noise. The illustrated trellis diagram includes eight states.

Each state $S_t$ corresponds to the three most recent channel input bits, $[x_{t-2}, x_{t-1}, x_t]$. Every state $S_t$ can have eight different values depending on the values of the channel input bits. The following is a list of the eight different state values and corresponding index values assigned to each of the states:

$$[0, 0, 0] - 0$$
$$[0, 0, 1] - 1$$
$$[0, 1, 0] - 2$$
$$[0, 1, 1] - 3$$
$$[1, 0, 0] - 4$$
$$[1, 0, 1] - 5$$
$$[1, 1, 0] - 6$$
$$[1, 1, 1] - 7.$$

As illustrated in the trellis diagram, the states at time t are connected to states at time t+1, which is further connected to states at time t+2 (not shown), etc. Since the states are defined as $S_t=[x_{t-2}, x_{t-1}, x_t]$ and $S_{t+1}=[x_{t-1}, x_t, x_{t+1}]$, a valid state transition (i.e., trellis branch) between time t and t+1 requires that the connected states $S_t$ and $St_{+1}$ have the same values for $x_{t-1}$ and $x_t$.

The trellis branch connecting states $S_t$ and $S_{t+1}$ has input signal $x_{t+1}$ and output signal $g_{t+1}=x_{t+1}*f_0+x_t*f_1+x_{t-1}*f_2+x_{t-2}*f_3$. In this illustrative channel, there can be 16 different trellis branches with different branch output values. For each trellis branch, the branch metric can be computed as $(y_{t+1}-g_{t+1})^2$. If the channel noise were correlated in time, more states would generally be required to take this noise correlation into account. The trellis branch metric computation may also need an extra noise compensation (or whitening) filter. In some embodiments, the trellis branch output signal $g_{t+1}$ may be a nonlinear function of channel inputs and the noise statistics may also vary for different trellis branches. For this kind of nonlinear signal or data-dependent noise channels, the branch metric may be computed based on the nonlinear signal and variant noise statistics.

Figure 3A:
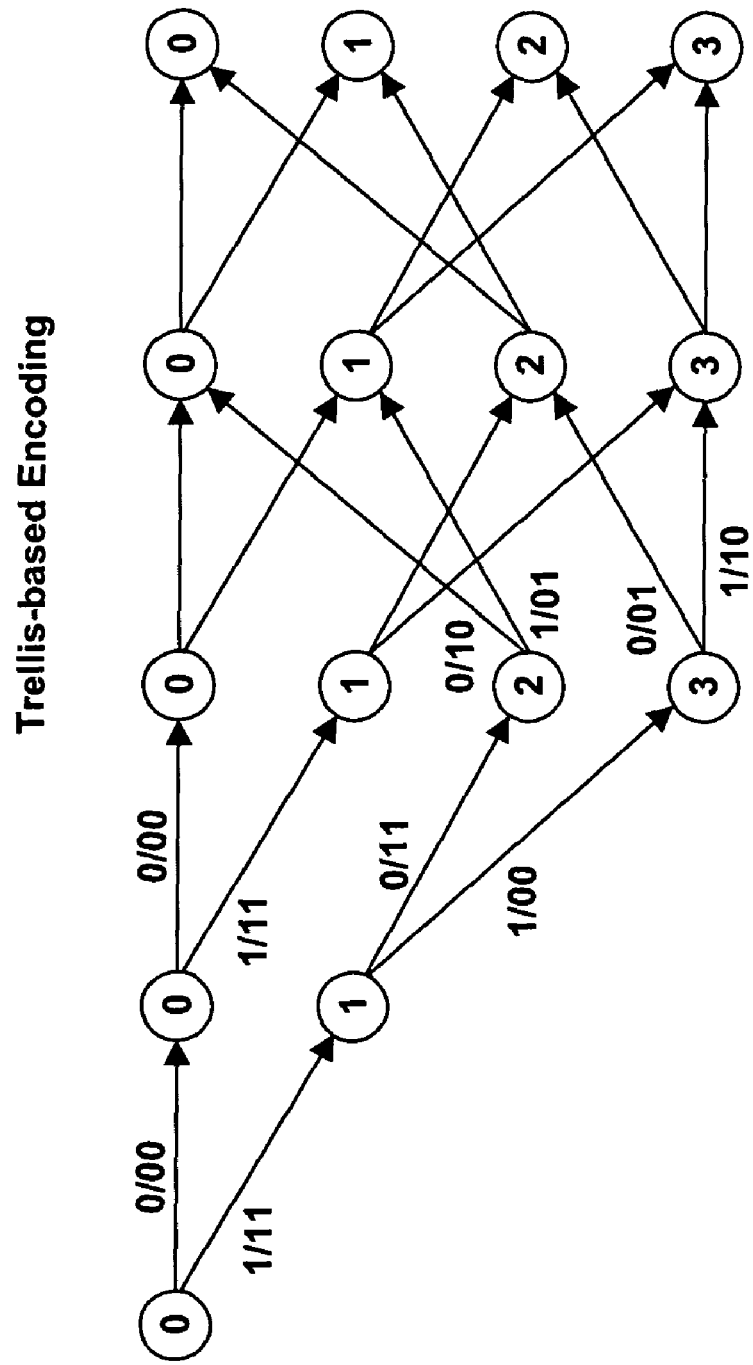
FIG. 3A is a trellis diagram of an exemplary trellis-based code.
Figure 3B:
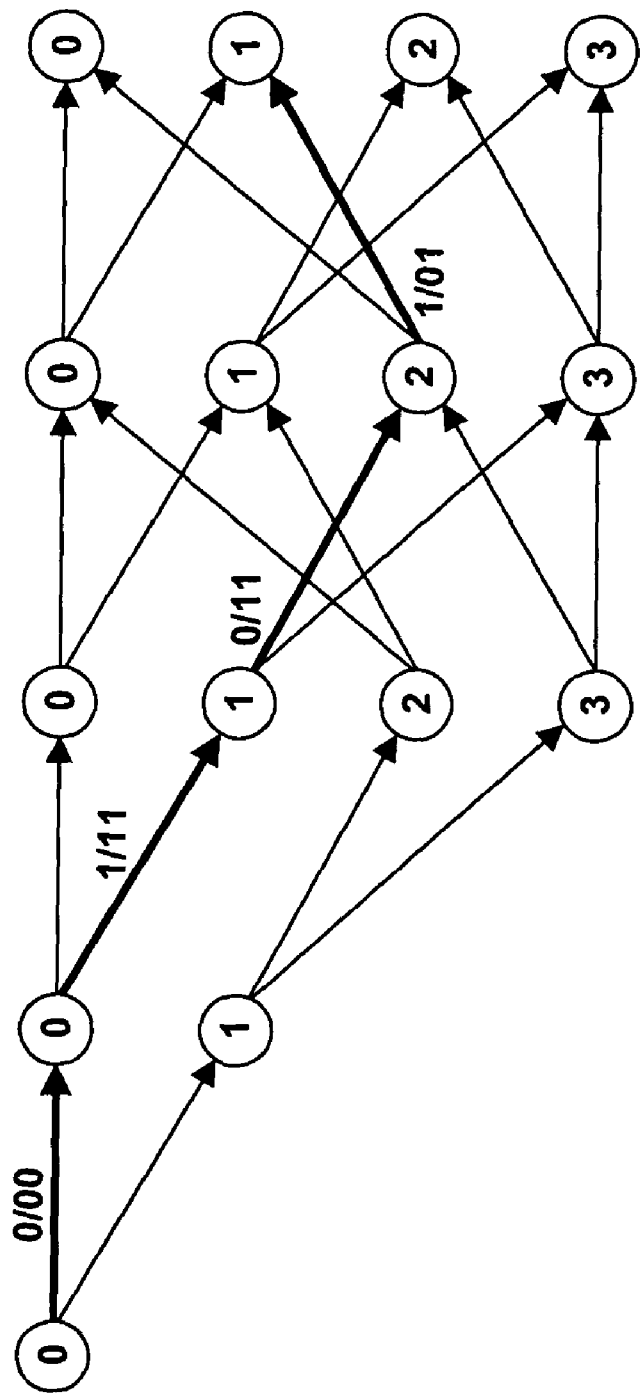
FIG. 3B is a diagram of an exemplary encoding path through the trellis diagram of FIG. 3A.

Referring now to the illustrated system of FIG. 1B, trellis-based encoding and decoding is also based on a trellis diagram. One example of a trellis diagram for a trellis-based encoder is shown in FIG. 3A. The illustrated trellis diagram includes four states, with state zero being the initial state. Each stage includes two branches exiting the state, and, after the second stage, each stage includes two branches entering the state. Each branch is associated with user information and parity information. In the illustrated embodiment, the user information is a single bit, and the parity information includes two bits. This is shown by the labels "u/pp" next to each branch, where u designates the user bit associated with the branch and pp designates the parity bits generated by choosing the branch. Encoding is initiated by starting at the initial state. From there, branches that correspond to the user information to be encoded are chosen, and the parity information corresponding to the chosen branches are output by the trellis-based encoder. FIG. 3B shows an example of an encoding path through the trellis diagram of FIG. 3A. In the illustrated example, the branch selections in the encoding path correspond to the four-bit user information "0101," as shown by the user bit portions of the branch labels. The parity information produced by this encoding path is "00111101," as shown by the parity bit portions of the branch labels.

The illustrated trellis diagrams of FIGS. 2A-3B are exemplary, and it is contemplated that the present invention applies to other trellis diagrams. Those skilled in the art will recognize that a trellis diagram can have more or less than four states, and each state can have more than two branches exiting and entering the state. Additionally, in connection with trellis-based encoding, each branch can be associated with more than one user bit, or more than two parity bits. In systematic encoders, one or more of the parity bits may be the same as the user bits, by definition. Additionally, the illustrated association of user and parity bits to particular branches is also exemplary. From this point on, for ease of explanation, the trellis structure of FIG. 2A will be used in explaining trellis-based encoding. However, the features mentioned herein, as well as other features of trellis-based codes not expressly mentioned herein, may vary depending upon the particular trellis-based code that is used. It is contemplated that the present invention also applies to such variations.

Figure 4:
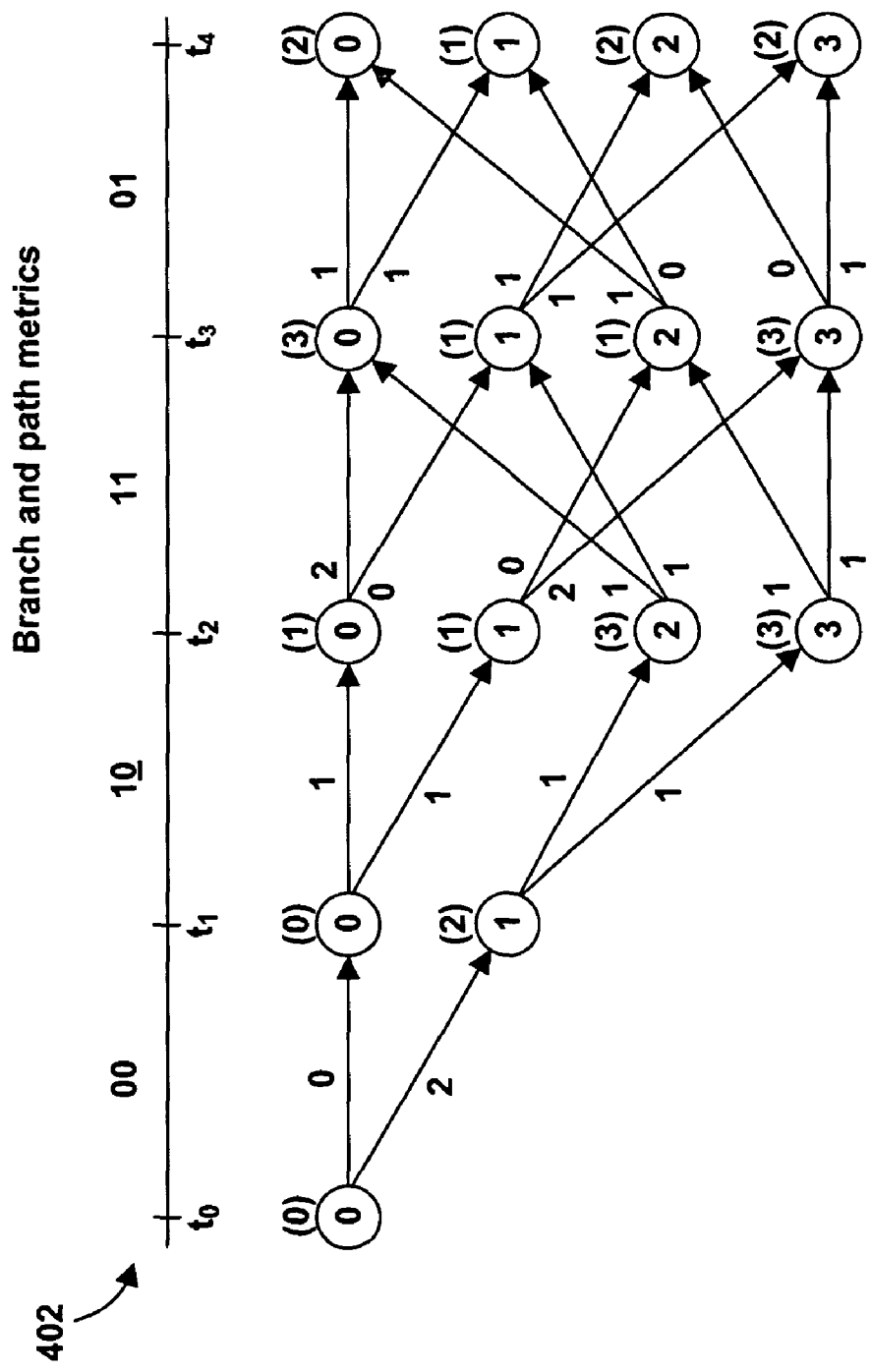
FIG. 4 is a diagram of exemplary decoding operation based on the trellis diagram of FIG. 3A.
Figure 5:
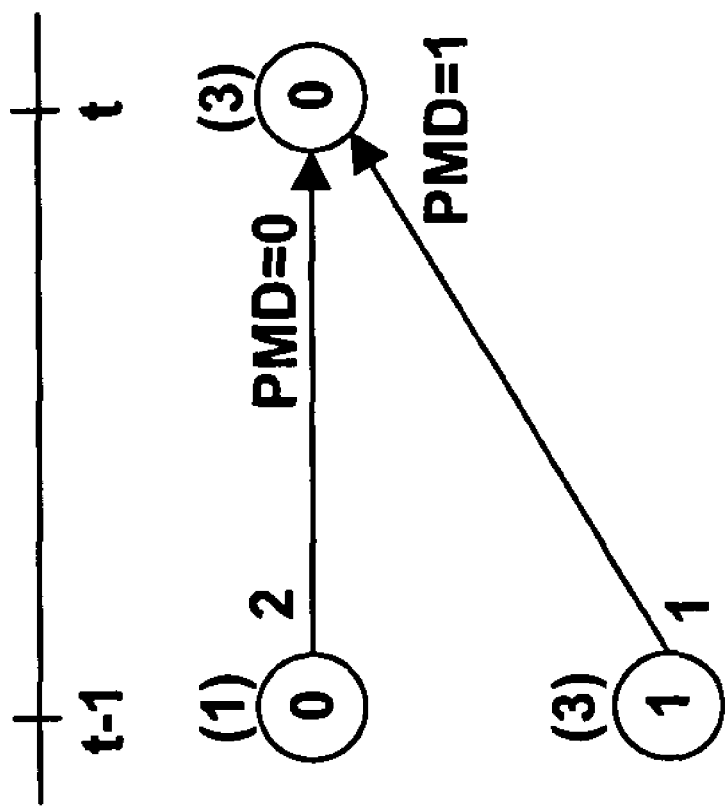
FIG. 5 is a diagram of path metric differences associated with branches of a trellis diagram.

FIGS. 4-5B will now describe aspects of Viterbi detection/decoding. As described above in connection with FIG. 1A, a Viterbi detector 124 operates based on the same trellis diagram as that of the ISI channel 120. Also, as described above in connection with FIG. 1B, a Viterbi decoder 116 operates based on the same trellis diagram as that of the trellis-based encoder 104. In both of the illustrated systems of FIGS. 1A and 1B, detection/decoding operate based on the same concept of computing metrics for each branch of the trellis based on the received signals/bits, and then identifying the path through the trellis that has the lowest cumulative metric. From this point on, the cumulative metric of a path will be referred to herein as a "path metric." Additionally, the path that has the lowest path metric will be referred to as the "winning path," and the trellis state at the end of the winning path will be referred to as the "winning state." All paths other than the winning path will be referred to as "losing paths."

Branch metrics can be computed in different ways. For example, in the system of FIG. 1A, the Viterbi detector 124 can compute branch metrics based on a modulator signal set (also called a "constellation") and based on a graphical representation of the signal set in a coordinate system. Using such a coordinate system, the Viterbi detector 124 can compute the branch metrics based on the Euclidean distance between an output signal of the ISI channel 120 and the output signals associated with branches of the trellis. In the system of FIG. 1B, the Viterbi decoder 116 can compute branch metrics based on Hamming distance between the detected parity bits 114 and the parity bits associated with branches of the trellis. In some ISI channel, branch metric computation may be quite complex because the channels may be nonlinear and may involve data-dependent noise correlation, which requires nonlinear branch metric computation. In this situation, noise variance may not be the same for all trellis branches, so conventional methods based on linear matched filters for evaluating branch metrics may not be accurate. Therefore, for some ISI channels, noise variance may depend on particular trellis branches, and different filters may need to be used for different trellis branches. Because of these complexities of ISI channels, the Viterbi detection/decoding operation will be explained herein based on the illustrated system of FIG. 1B, wherein the Viterbi decoder will operate based on Hamming distances as branch metrics. However, it will be understood that aspects of the disclosed invention also apply to other types of branch metrics.

Referring now to FIG. 4, there is shown one example of detected information 402 that includes a bit error. In the example, the detected information 402 is "001<u>0</u>1101," which differs in the fourth bit from the parity information "001 <u>1</u>1101" from the encoding path of FIG. 3B. However, as the following will show, the Viterbi decoder will be able to correct this error.

The detector of FIG. 4 uses the well-known Viterbi algorithm (i.e., maximum-likelihood decoding) to recover the user information. As described above, the decoder chooses the trellis path that most likely occurred based on the potentially erroneous detected information 402. The sequence detection nature of the decoding gives the Viterbi decoder an ability to correct errors. In particular, if a small portion of the detected information 402 is erroneous (e.g., only bit four), the decoder can still produce as the most likely path the original path that occurred during encoding.

The decoder makes the maximum likelihood decision based on metrics that are computed and associated with the trellis branches. These metrics are shown for each branch of FIG. 4. In the illustrated embodiment, the metric that is used is called "Hamming distance," which is a measure of the number of bits that are different between two bit strings. In Viterbi decoding, the metric associated with a branch can be computed as the Hamming distance between the parity bits associated with the branch and the detected bits associated with the trellis stage containing the branch. For example, the first trellis stage (stage $t_1$) is associated with the detected bits "00." In the first stage, the top branch is associated with parity bits "00." Because there are no differing bits, the Hamming distance associated with the top branch is zero. In contrast, the bottom branch is associated with parity bits "11," which have two differing bits compared to detected bits "00." Therefore the Hamming distance associated with the bottom branch is two.

Additionally, each state keeps track of a path metric for the lowest-metric path leading to that state. This lowest-metric path to a particular state will be referred to herein as the winning path to that state. The initial state has a path metric of zero. Taking the top branch from the initial state, the zero path metric plus the zero branch metric results in zero path metric for state zero at $t_1$. Taking the bottom branch from the initial state, the zero path metric plus the branch metric of two results in a path metric of two for state one at $t_1$. At time $t_1$, state zero has the lowest cumulative metric. By definition, the state that has the lowest cumulative metric is considered to be the most-likely state (or "winning state") for that time. Therefore, at time $t_1$, it can be seen that state zero is the winning state. Performing the same computations at time $t_2$, FIG. 4 shows that the error in the detected information 402 has resulted in a tie between state zero and state one for the lowest path metric at time $t_2$. Because no state at time $t_2$ has zero path metric this is an indication that the detected data 402 contains an ambiguity at time $t_2$. However, the detector may be able to resolve this ambiguity based on the subsequently detected bits.

Beginning with time $t_3$ in FIG. 4, it can be seen that there are two branches entering each state. For each state at time $t_3$, the path metric computation chooses the branch entering the state that provides the lowest path metric. For example, two branches enter state zero at time $t_3$. The top branch corresponds to a path metric of 1+2=3, and the bottom branch corresponds to a path metric of 3+1=4. Because the top branch corresponds to a lower path metric, the path through the top branch corresponds to the winning path to state zero at time $t_3$. In this case, the top branch will be referred to herein as the "winning branch." In contrast, the lower branch will be referred to as a "losing branch." In general, there may be more than two branches entering a state. Among these branches, each branch corresponding to the lowest path metric can be referred to as a winning branch, and the remaining branches can be referred to as losing branches.

Referring again to FIG. 4, the computations for time $t_3$ result in a tie between state one and state two for the lowest path metric. Therefore, at time $t_3$, either state one or state two can be the winning state at time $t_3$. The computations for time $t_4$ result in state one alone having the lowest path metric. Therefore, it is certain that at time $t_4$, state one is the winning state. To determine the path through the trellis that results in the winning state at time $t_4$, we can traverse the trellis backwards from state one at time $t_4$, each time choosing the winning branch, i.e., the branch that leads to smaller and smaller path metrics, until the initial state is reached. It can be seen that performing this backward traversal will result in the same path through the trellis as the encoding path of FIG. 3B. Accordingly, the decoder was able to correct an error in the detected data 402 and correctly identify the encoding path. The user information (102, FIG. 1) can be recovered by taking the user bits associated with the branches in the winning path in order from the initial state to the winning state.

In one aspect of the invention, the disclosed technology can compute and store what will be referred to herein as "path metric differences" (PMD). The PMD of a branch is defined as the difference between the path metric of that branch and the path metric of a winning branch to the same destination trellis state. This concept can be seen more readily with reference to the example in FIG. 5 which shows a portion of an exemplary trellis occurring between a time t−1 and a time t. In the illustration, at time t−1, state zero has a path metric of one and state two has a path metric of three. The branch from state zero at time t−1 to state zero at time t has a branch metric of two and corresponds to a path metric of 1+2=3. The branch from state two at time t−1 to state zero at time t has a branch metric of one and corresponds to a path metric of 3+1=4. The top branch corresponds to the smaller path metric and is, therefore, the winning branch. The bottom branch is the losing branch. The PMD for the losing branch is equal to difference between the path metric for the losing branch (i.e., 4) and the path metric for the winning branch (i.e., 3). In the example of FIG. 5, the PMD for the bottom branch is 4−3=1. The PMD for a winning branch is zero, by definition. As illustrated by the example of FIG. 5, PMD is computed on a state by state basis for all of the branches entering a particular state. A winning branch entering a particular state has a PMD of zero, and a losing branch entering that state has a PMD that is the difference between the path metric for that losing branch and the path metric for the winning branch.

Figure 6:
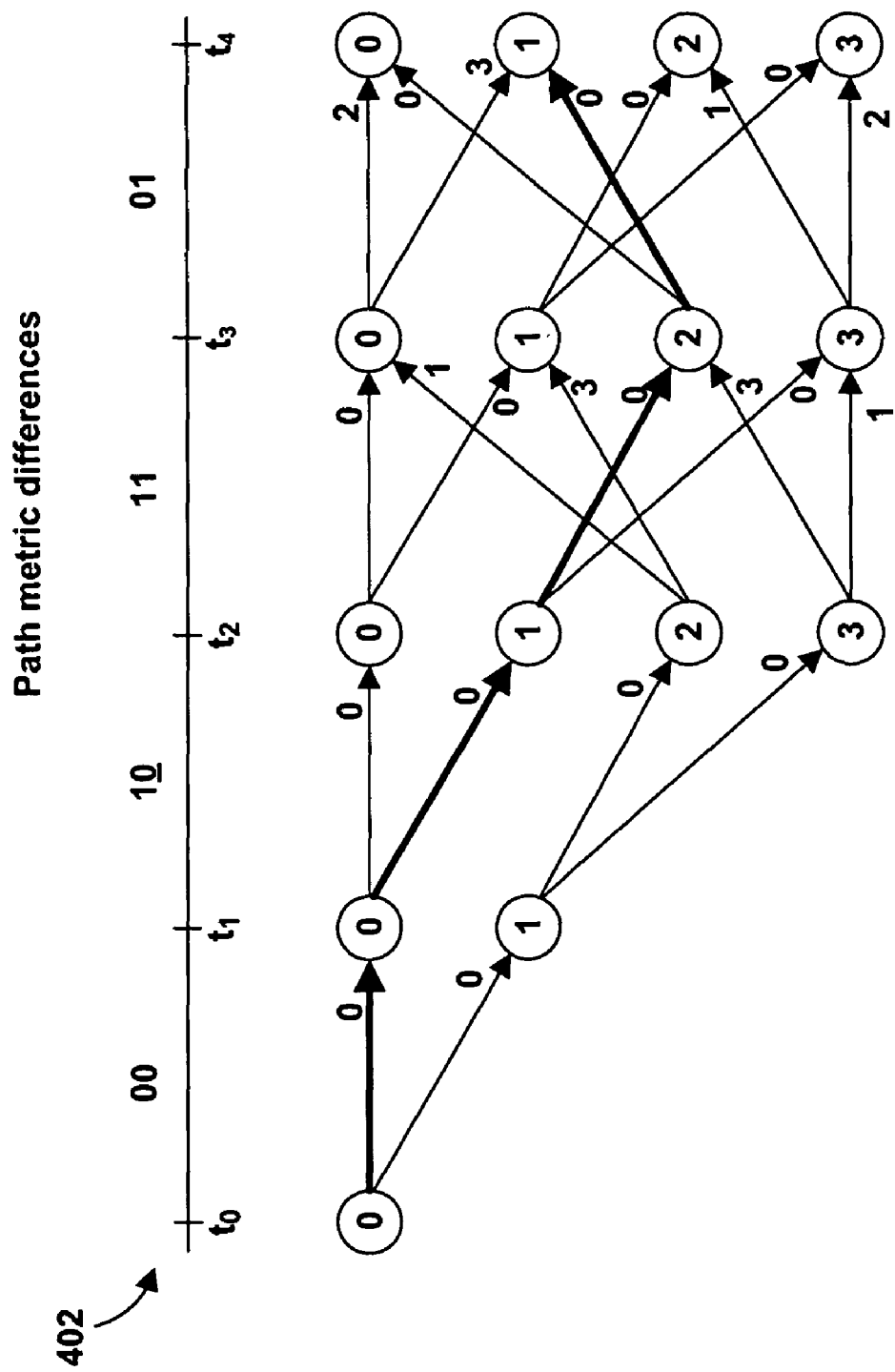
FIG. 6 is a diagram illustrating path metric differences in the trellis diagram of FIG. 3A.

FIG. 6 shows PMD computations for the trellis branch and path metrics of FIG. 4. The PMD values for the states in times $t_1$ and $t_2$ are zero because there is only one branch entering those states and therefore these branches are by default winning branches. Uses for PMD values will become clear in the paragraphs that follow.

Returning now to FIG. 4, although the decoding operation in FIG. 4 resulted in identifying the correct path, Viterbi decoding can in some situations produce an incorrect path. In this case, it may be helpful to identify alternate paths and their likelihoods of occurring. In one embodiment, an alternate path can be identified by starting at the winning state and then tracing branches back through the trellis. In one embodiment, at the first trace back branch selection, rather than choosing the winning branch, the losing branch can be chosen. From there, either winning branches or losing branches can be selected to identify different alternate paths. As previously described in connection with path metric differences, a winning branch will have a PMD of zero, and a losing branch will have a PMD greater than zero. Therefore, using PMD values can be one way to determine which branches to choose during trace back.

Figure 7A:
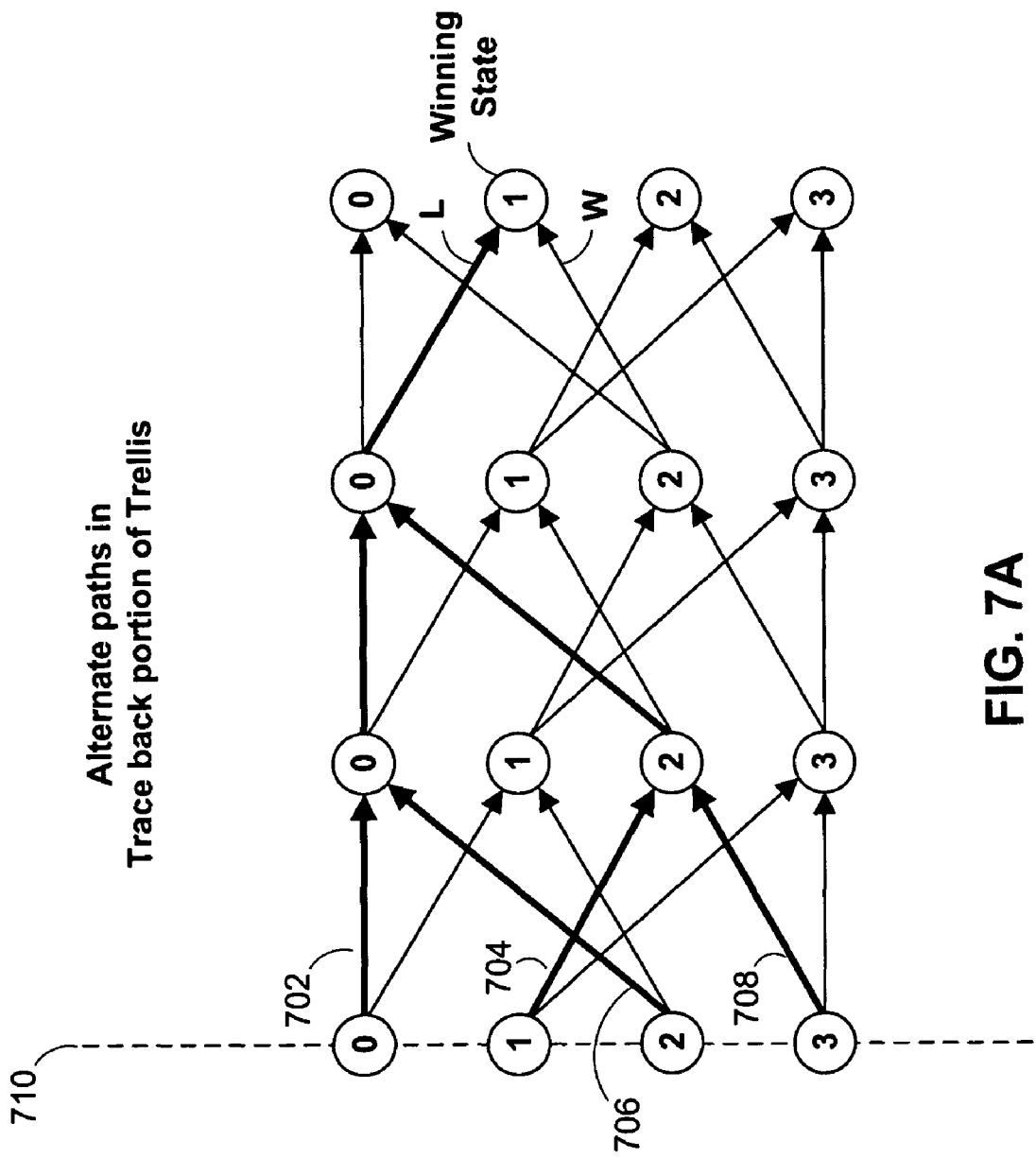
FIG. 7A is a diagram of exemplary alternate paths resulting from tracing back through a portion of a trellis, in accordance with one aspect of the invention.

FIG. 7A shows a trace back portion of a trellis in accordance with the trellis structure of FIG. 4. FIG. 7A does not show metrics or path metric differences to simplify the illustration. It is assumed that, after decoding, state one is the winning state (the winning path is not shown). Applying the trace back approach described above to the illustrated trellis trace back portion, four alternate paths 702-708 can be identified after tracing back three trellis stages from the winning state. The number of trace back stages minus one will be referred to herein as "trace back depth." The trellis stage at the boundary of the trace back portion of the trellis will be referred to as the "boundary stage" 710. As shown in FIG. 7A, a trace back depth of two for the illustrated trellis provides alternate paths from each trellis state in the boundary stage 710 to the winning state. Because each state in the boundary stage 710 is covered by an alternate path, tracing back further from this point to identify more alternate paths may provide diminishing returns. However, more alternate paths can be identified by tracing from the winning state back through the winning branch. In other embodiments where the trellis may include a larger number of states and/or a larger number of branches entering and exiting each state, the trace back depth may vary to accommodate the number of alternate paths desired for those trellises. In one embodiment, the trace back depth and the desired number of alternate paths can be predetermined so that a trace back operation will always provide the desired number of alternate paths.

Figure 7B:
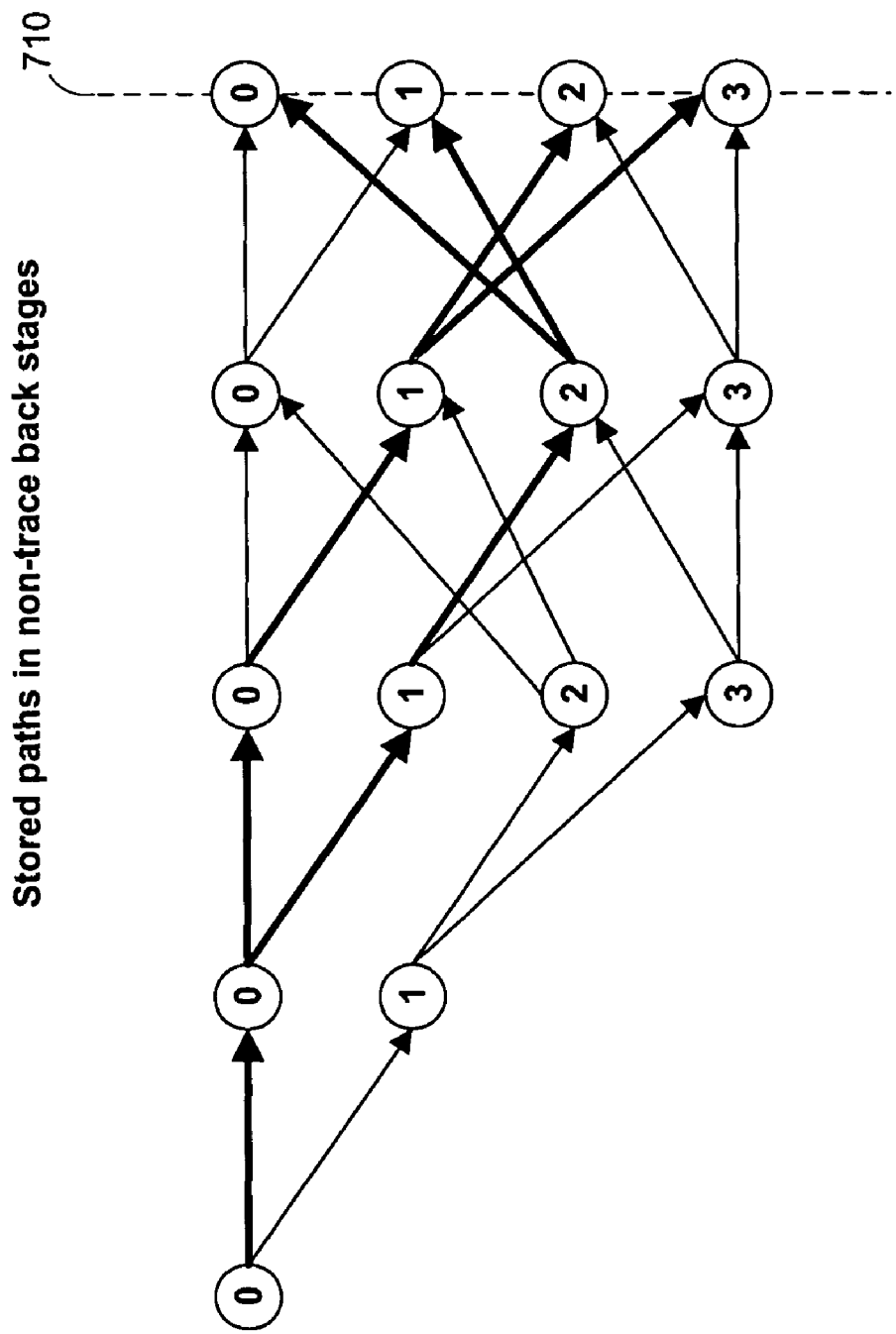
FIG. 7B is diagram of exemplary winning paths to each state in a trellis stage in a non-trace back portion of a trellis, in accordance with one aspect of the invention.
Figure 8:
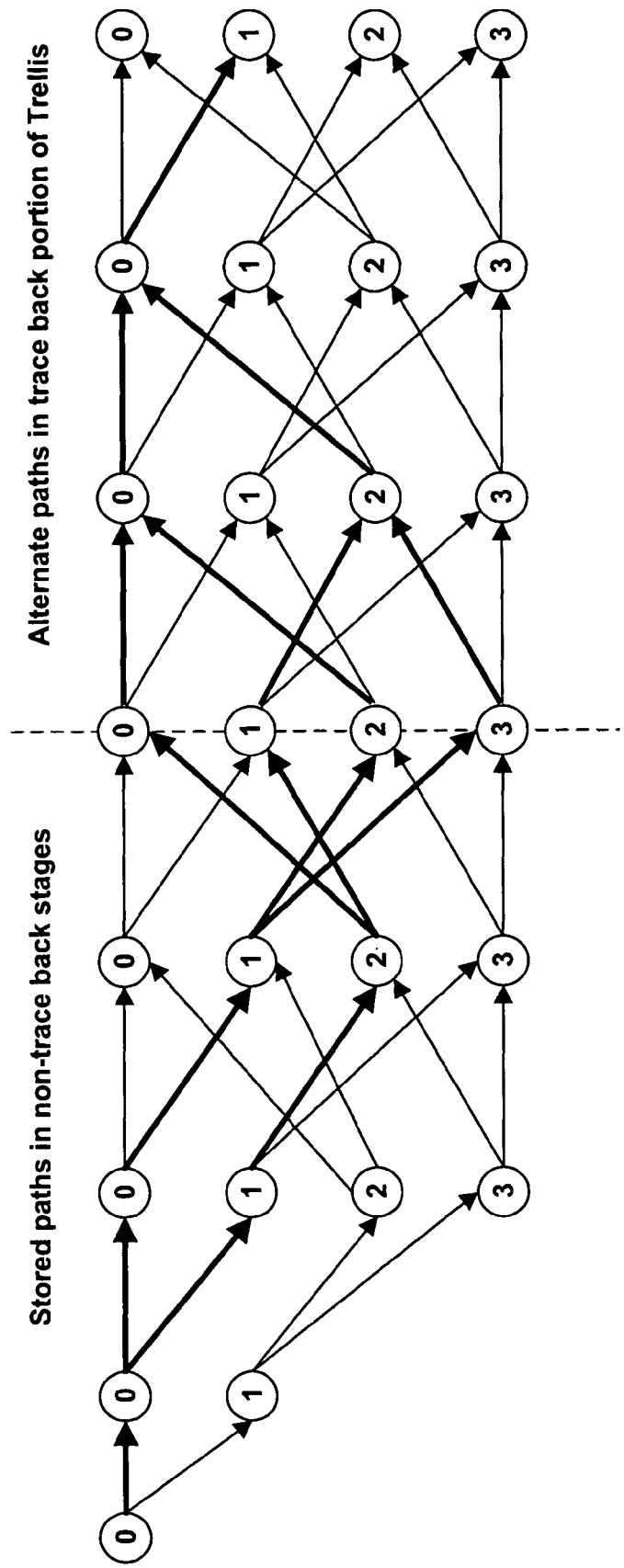
FIG. 8 is a diagram of an exemplary trellis that includes a trace back portion and a non-trace back portion.

With continuing reference to FIG. 7A, the illustrated trellis portion shows only the trace back portion of the trellis. The trellis also includes a non-trace back portion, which is shown in FIG. 7B. The same boundary stage 710 divides the trace back (FIG. 7A) and non-trace back (FIG. 7B) portions of the trellis. FIG. 8 shows a diagram of the entire trellis.

In accordance with one aspect of the invention, and referring to FIG. 7B, part of the non-trace back portion of the trellis can be stored in a memory or a storage. In one embodiment, only information for the winning paths to each state in the boundary stage 710 need to be stored. No losing paths in the non-trace back portion of the trellis need to be stored. This is because when the boundary stage 710 advances one trellis stage, the winning paths to the new boundary stage (not shown) must go through one of the existing winning paths shown in FIG. 7B. As described above herein, the winning path to a state can be identified using path metric differences. In particular, the path having a path metric difference of zero is the winning path into a state.

Referring now to FIG. 8, the complete paths of the alternate paths are shown. Each of the alternate paths corresponds to user information, which can be identified by taking the user bits associated with the path branches. The winning path (not shown) also corresponds to user information. In accordance with one aspect of the invention, the user bits for the winning path (not shown) can be compared to the user bits for the alternate paths to generate error patterns. For example, suppose the winning path corresponds to user bits "0011011" and an alternate path corresponds to user bits "0111101" These user bit sequences can be compared to form an error pattern in which locations of the bit differences are shown by a "1" symbol, and the locations having the same bits are shown by a "0" symbol. Accordingly, for the example above, the error pattern is "0100110." A straightforward XOR operation can be used to generate the error patterns.

In accordance with one aspect of the invention, alternate paths and their corresponding error patterns can be associated with likelihood values. The likelihood values for different alternate paths/error patterns can be compared to determine which error patterns are more likely to occur. In one aspect of the invention, the likelihood value for an alternate path/error pattern can be the path metric difference between the alternate path and the winning path. In one embodiment, path metric for a path can be computed using branch metrics (e.g., FIG. 4) by summing the branch metrics corresponding to the path. After the summations are computed, a path metric difference between the winning path and an alternate path can be computed by subtracting path metrics. Computed in this manner, a higher likelihood metric value can indicate that an error pattern is less likely to occur.

In accordance with one aspect of the invention, the path metric difference between the winning path and an alternate path can be computed using the PMD values. In particular, summing the PMD values corresponding to losing branches in an alternate path provides the path metric difference between the alternate path and the winning path. Intuitively, this provides the desired result because a PMD value later in the trellis already takes into account the branch metrics of previous winning branches. Therefore, when tracing backwards through an alternate path, every losing branch in the alternate path represents an incremental gain in the path metric difference. Furthermore, only PMD of losing branches in the trace back portion of a trellis need to be summed, because the non-trace back portions of the alternate paths only include winning branches. However, since the PMD of winning branches is zero, in certain embodiments, it may be more efficient to simply sum all of the PMD values corresponding to the trace back portion of an alternate path. It can be seen that computing the likelihood metric using a PMD sum requires fewer operations than computing the likelihood metrics using the branch metrics of FIG. 4. Therefore, a benefit of using PMD values is a savings in computation time and resources.

Figure 9:
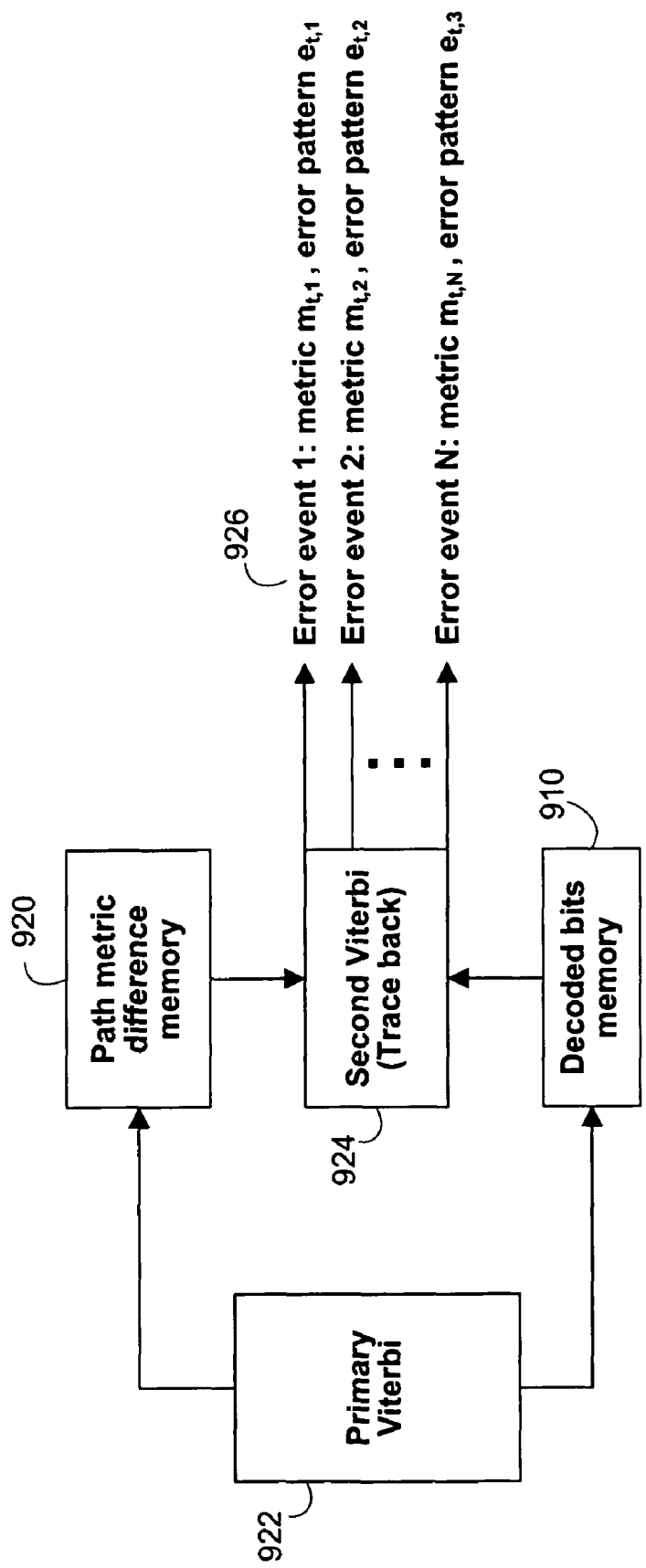
FIG. 9 is a block diagram of an exemplary error event generating system in accordance with one aspect of the invention.

In accordance with one aspect of the invention, alternate paths, error patterns, and likelihood values can be computed using two Viterbi blocks. One exemplary system is shown in FIG. 9, which includes a primary Viterbi block 922 and a second Viterbi block 924. The primary Viterbi block 922 can compute path metric differences for branches in the trace back portion of the trellis and can determine the global winning path and thus the decoded information. The path metric differences can be computed by an add-compare-select (ACS) circuit (not shown) in the primary Viterbi 922. The path metric differences can be stored in a path metric difference memory 920, and the decoded bits corresponding to the winning path can be stored in a decoded bits memory 910. Based on the winning state in each trellis stage identified by the first Viterbi block 922, the second Viterbi block 924 can perform trace back to identify alternate paths. The second Viterbi block 924 can generate error patterns 926 based on the trace back portions of the alternate paths, the non-trace back portions of the alternate paths stored in path memory of the secondary Viterbi, and the decoded bits stored in the decoded bits memory 910. The second Viterbi block 924 can also compute likelihood metrics 926 for the error patterns using the PMD values stored in the path metric difference memory 920, as described above herein. The error patterns and likelihood metrics together are also referred to herein as "error events."

In one aspect of the invention, the second Viterbi block 924, in addition to identifying alternate paths, can also eliminate certain alternate paths based on various elimination criteria. For example, in one embodiment, the second Viterbi 924 can include a metric threshold and can eliminate alternate paths whose likelihood metrics exceeds the threshold. In one embodiment, the second Viterbi 924 can include a set of predetermined error patterns of interest and can keep only those alternate paths that produce error patterns identical or similar to the predetermined error patterns of interest. In one embodiment, the second Viterbi 924 can eliminate alternate paths that include more than a predetermined number of losing branches. Other elimination criteria are possible, and it is contemplated that other elimination criteria can be used.

The error events can be used for various applications, one of which will be described later herein in connection with FIG. 12. For example, some applications that can make use of error events include a soft Reed Solomon decoder or iterative decodable codes that use log-likelihood ratios of bits or codeword syndrome values.

Figure 10:
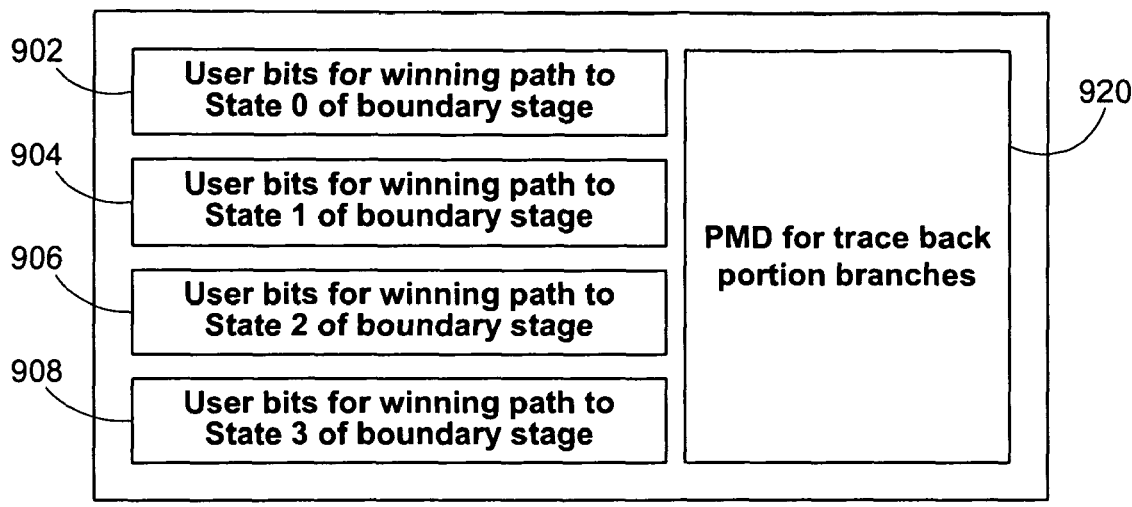
FIG. 10 is a block diagram of a memory that is storing exemplary user information corresponding to the winning paths of FIG. 8, in accordance with one aspect of the invention.
Figure 11:
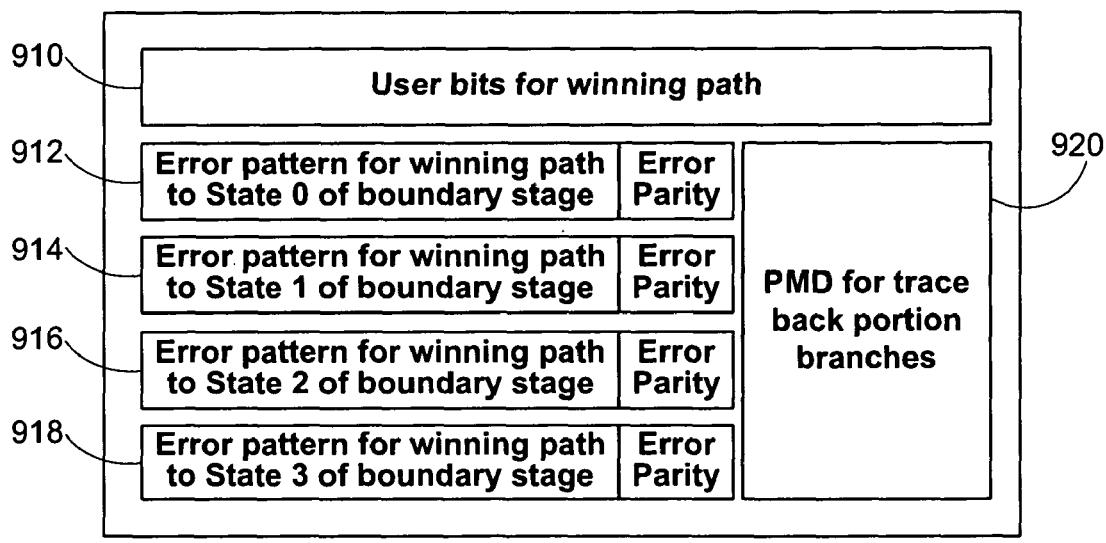
FIG. 11 is block diagram of a memory that is storing exemplary error patterns corresponding to the winning paths of FIG. 8, in accordance with one aspect of the invention.

In accordance with one aspect of the invention, FIGS. 10-11 show memories that store information for winning paths in the non-trace back portion of a trellis. In accordance with one aspect of the invention, the information in the memories can be dynamically updated each time the boundary stage advances one trellis stage. Referring to FIG. 10, the illustrated memory stores user bits for the winning paths to the states of a boundary stage 902-908. The winning path of the trellis and each alternate path must have a non-trace back portion that corresponds to one of the stored paths. Therefore, the user bits 902-908 for the non-trace back portions of the winning path and any alternate path can be retrieved directly from the memory. The retrieved user bits 902-908 can then be used to generate the non-trace back portions an error pattern through an XOR operation, as described above. The trace back portion of the error event is determined by taking the difference of the user bits of the trace back portion of the alternative trellis path and the trace back portion of the decoded information 910. In one embodiment, the memory can also store the PMD values 920 for branches in the trace back portion of the trellis. As described above herein, the PMD values 920 can be used to compute likelihood metrics for the alternative paths/error events. PMD values need not be stored for the non-trace back portion of the trellis because the stored paths in the non-trace back portion only include winning branches, which have PMD values of zero, by definition.

Referring now to FIG. 11, there is shown one aspect of the invention in which a memory includes user bits for the winning path of the trellis 910 and error patterns for the winning paths to the boundary stage 912-918, where each error pattern is maintained with respect to the user bits of the winning path of the trellis 910. Additionally, each path may also include an error pattern parity syndrome, which is initialized/reset as the trellis section aligns with the beginning of a parity coded code word, and is recursively updated by applying a single parity check (SPC) operation to the error pattern bits that get into the error pattern memory as the trellis advances, until the end of a parity coded code word. This aspect of the invention will be described in more detail in connection with FIG. 12. The winning path of the trellis and each alternate path must have a non-trace back portion that corresponds to one of the winning paths to the boundary stage. Therefore, the error patterns for the non-trace back portions of any alternate paths can be retrieved directly from the memory. In this manner, the error pattern computation is simplified by being limited only to the trace back portion of the trellis. As before, the memory of FIG. 11 can also store the PMD values 920 for branches in the trace back portion of the trellis.

The user bits memory of FIG. 10 and the error pattern memory of FIG. 11 may have a finite path memory length. The older data may be truncated every time the trellis advances. Thus, the memory may only contain the most recent segment of the path leading to the boundary state. The path memory length may be chosen to be large enough such that all paths almost always converge onto the same trellis branches within the path memory and thus the benefit for having a longer path memory length becomes negligible.

Figure 12:
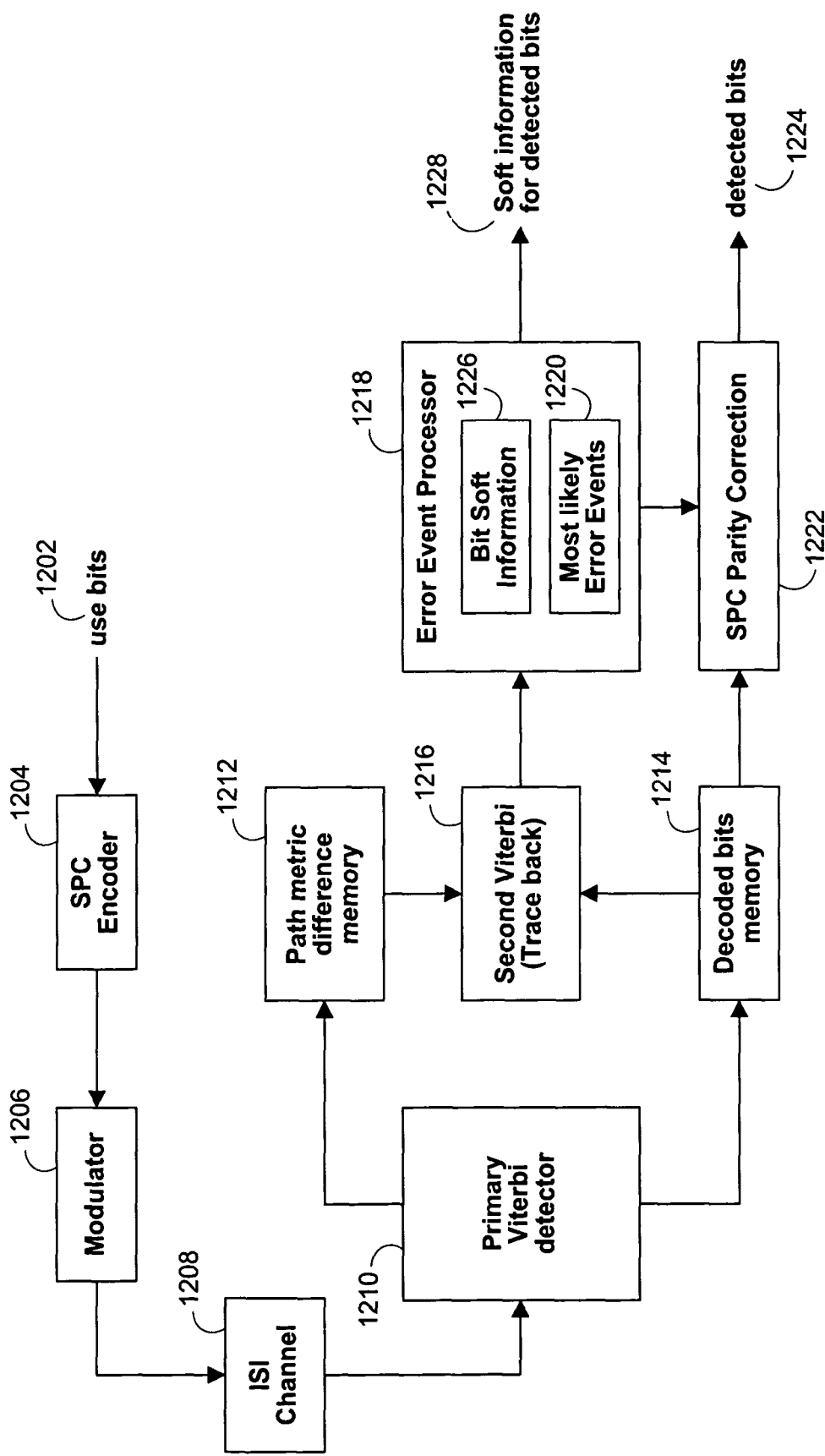
FIG. 12 is a block diagram of an exemplary system for using error events for SPC parity correction and soft information generation, in accordance with one aspect of the invention.

Referring now to FIG. 12, there is shown a communication/storage system that uses error events to perform error correction, in accordance with one aspect of the invention. In the illustrated embodiment, the error correction is performed using a single parity check (SPC) code. It should be noted that this parity check code is separate from the parity information generated by the trellis-based encoder discussed above. This parity check code parity bits, when added to a code word, becomes a user bit for the convolutional encoder. On the encoding side, user bits 1202 are encoded by a SPC encoder 1204. The SPC encoder 1204 can operate based on a block length L, so that L user bits 1202 are encoded as a group. The SPC encoder 1204 can generate a parity bit (not shown) and append the parity bit to the L user bits to form a code word of L+1 bits. The parity bit can be generated, for example, to cause the code word to have even parity error syndrome. The code word is modulated by a modulator 1206 and communicated to an ISI channel 1208.

In some other embodiments, a multiple-bit parity syndrome may be used instead of a single-bit parity syndrome. For multiple-bit parity syndromes, instead of determining odd and even parity error syndromes, the syndrome values may be computed based on a parity check matrix and may have additional possible values. Further, two or more multiple-bit parity syndromes may be combined to form a combined multiple-bit parity syndrome. The combined multiple-bit parity syndrome may be more likely than any of the individual multiple-bit parity syndromes, i.e., combined multiple-bit parity syndrome may be associated with a smaller error event metric than any of the individual multiple-bit parity syndromes.

The illustrated system includes the two-Viterbi system previously described herein in connection with FIG. 9. A primary Viterbi detector 1210 computes path metric differences and determines a winning path for the trellis. The PMD values are stored in a path metric difference memory 1212, and the decoded bits associated with the winning path are stored in a decoded bits memory 1214. A second Viterbi 1216 performs trace back to find alternate paths, generates error patterns based on the alternate paths and the winning path, and computes likelihood values for the error patterns, as described above herein.

In accordance with one aspect of the invention, the error events are communicated to an error event processor 1218, which identifies the most-likely error events 1220 based on the likelihood values. Using the most-likely error events 1220, a SPC parity correction circuit 1222 can correct potential errors in the decoded bits 1214 to generate corrected bits 1224. The error event processor 1226 can include a bit soft information block 1226 that generates soft reliability information 1228 indicating the reliability of the corrected bits 1224. One embodiment of the bit soft information block will be described in connection with FIG. 14.

Referring to the SPC parity correction circuit 1222, the circuit 1222 can process code words of decoded bits 1214 to determine the parity error syndrome of the code words. Each code word should, for example, have an even/zero parity error syndrome. If the parity error syndrome is not even (i.e., it is odd or one), the SPC parity correction circuit 1222 will need to flip an odd number of bits in the code word to produce even parity error syndrome. In accordance with one aspect of the invention, the SPC parity correction circuit 1222 can determine which bits to flip based on the most-likely error events 1220 that have an odd parity. In other words, the SPC parity correction circuit 1222 can select error events 1220 that have an odd parity error syndrome. The selected error patterns can be used to flip bits in the code word according to the error event, to produce an even parity error syndrome in the code word.

The location of the error event within the code word may be determined by the time index of the trellis where the error event is found. For example, an error event found at trellis index 5 has a code word location of 5. In each code word there may be multiple candidate error events with the desired parity error syndrome. In this embodiment, the error event with the smallest error event metric is selected and the other error events are discarded. Thus, the parity correction is performed when all of the error events that can possibly overlap the code word are evaluated and their metrics compared (i.e., the parity correction is performed for each code word and not for each error event). In some embodiments, where an error event has multiple bits and some of the bits are outside of the code word boundaries, the outside portion of the error event will not contribute to the parity correction unless this outside portion does not alter the syndrome of the adjacent code word.

In accordance with one aspect of the invention, and with reference also to FIG. 11, the parity error syndrome of the non-trace back portion of an error pattern (also called "error parity") can be maintained in a memory. This stored parity error syndrome can be used to more quickly compute the parity error syndrome of an error event. Each time the boundary stage advances one trellis stage, the stored parity error syndrome can be updated based on a new error pattern bit. However, the stored parity error syndrome can be reset to zero whenever one code word ends and another code word begins. For computing the parity of a cross-boundary error event corresponding to the previous code word, the stored error event syndrome for the previous code word is still needed after the trellis advances into a new code word boundary, thus two copies of the error event parity syndromes are needed in the memory, one for the previous code word, and one for the current code word. These two sets of parity syndrome bits record/track the contribution of the non-trace-back portions of the error events to the error event syndromes for the current code word and the error event syndromes for the previous code word. The role of these two sets of error event parity bits alternate as the trellis advances across code word boundaries.

In accordance with one aspect of the invention, in connection with SPC parity correction, it may be possible for an error event to span more than one code word. In one embodiment, error patterns for more than one code word can be stored in a memory or storage to accommodate such situations. Because error events may overlap multiple code words, multiple error event parity computing processors and error event metric comparators for different code words may be required. For each code word, the most likely error event with the desired parity error syndrome value is found (i.e., the error event having the smallest metric).

In accordance with one aspect of the invention, the error events may be defined on the detected bits instead of on the user bits. That is, the primary Viterbi computes the winning path in order to detect the winning path sequence of user bits. The difference between this winning path sequence of detected bits and the bits along alternative paths defines an error event.

In accordance with one aspect of the invention, for ISI channels there is no encoder or decoder. In other words, the user bits are the same as the coded bits and there are no parity bits in the trellis. For a convolution code trellis used on an ISI channel, there may be three different variables for each trellis branch, trellis input (user bits), trellis output bits (parity bits or coded bits), and the transmitted ISI signal(s). Each branch may correspond to multiple inputs/outputs/signals.

Figure 14:
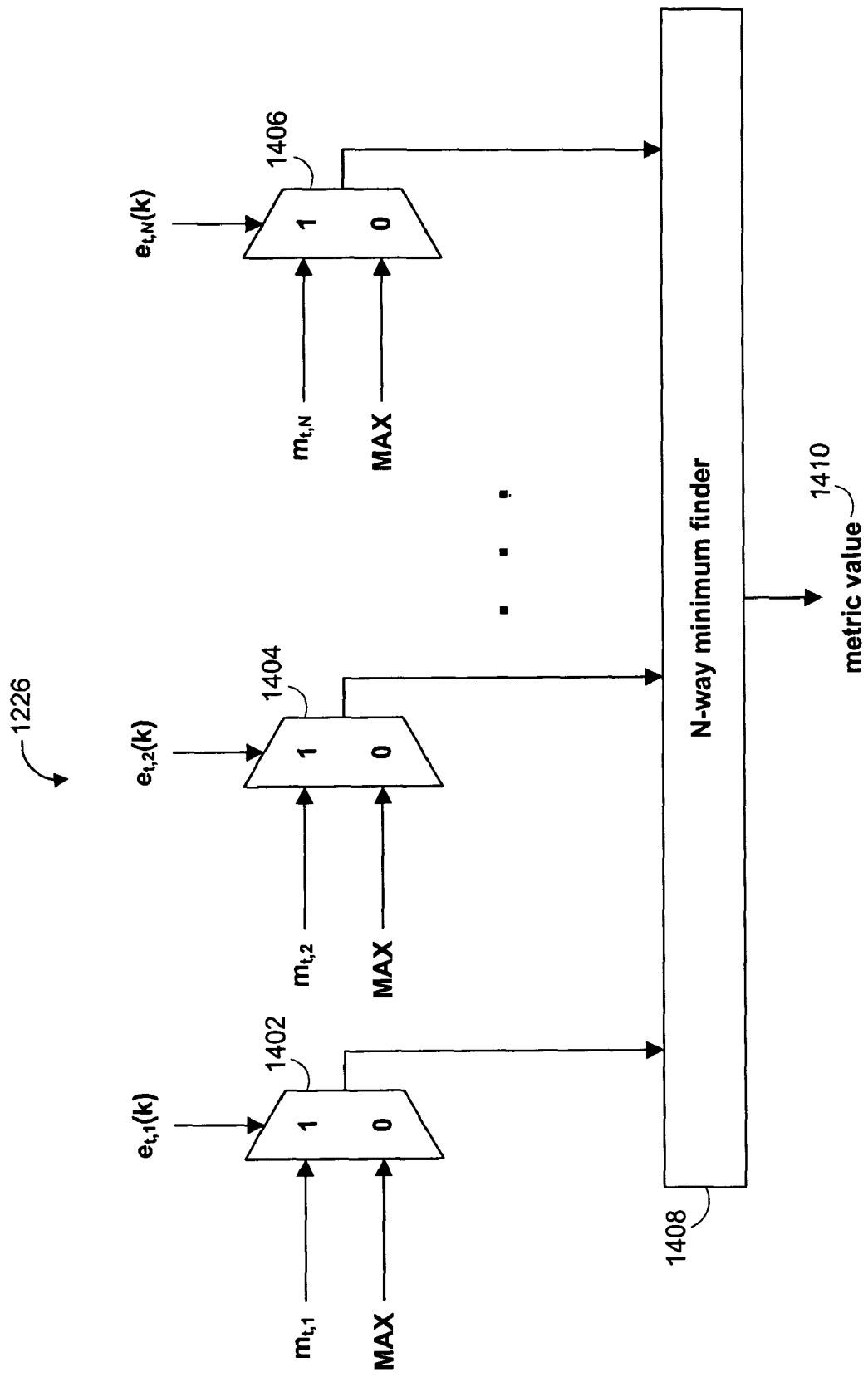
FIG. 14 is an exemplary system for generating soft information based on the error events of FIG. 9.

Referring now to FIG. 14, there is shown one embodiment of a bit soft information circuit 1226 that generates reliability metrics for corrected bits. In the illustrated embodiment, the reliability metric 1410 for a bit can be the smallest likelihood value associated with any error event indicating there is an error in that bit.

For example, suppose the circuit is computing a reliability metric 1410 for a bit location k, and N error patterns $e_{t,1}$, $e_{t,2}, \ldots, e_{t,N}$, generated at a time t, cover bit location k. For all error patterns that include an error mask of "1" in bit location k, the likelihood values associated with those error patterns are compared, and the lowest likelihood value (i.e., the most likely error event) is selected to set/update the reliability metric for bit location k. This operation is performed by a series of multiplexers 1402-1406, where the number of multiplexers is the same as the number of error patterns generated at each time unit. The control input to each multiplexer is an error pattern mask value, e.g., $e_{t,1}(k)$, for a bit location k. The "1"-input to each multiplexer is the likelihood value, e.g., $m_{t,1}$, associated with the error pattern controlling the multiplexer, and the "0"-input to each multiplexer is a default maximum value. A N-way minimum finder circuit 1408 produces the minimum multiplexer output value as the bit reliability metric 1410. Generally, a larger reliability metric value indicates a more reliable detection, and a smaller reliability metric value indicates a more ambiguous detection.

As an example, assume N error patterns are generated at each trellis time t, and each error pattern includes K bit locations. In this situation, a bit reliability metric can compare N likelihood values at each time unit, and L time units will cover the bit location. Therefore, the reliability metric for a single bit location will compare N*L likelihood values.

Error events and bit reliability metrics can be used for various applications other than SPC parity correction. For example, some applications that can make use of error events and bit reliability metrics include a soft Reed Solomon decoder or iterative decodable codes that use log-likelihood ratios of bits or codeword syndrome values. In another example, aspects of the disclosed invention can apply to parity codeword syndromes where the syndrome is computed from a parity check matrix of the code and the detected sequence of bits. Aspects of the disclosed invention can apply to systems in which only the all-zero syndrome is correct, or in systems in which non-all-zero syndrome values can also be correct. Different error events may corrupt a codeword into different syndrome values, and the corresponding error event metrics (or combinations of error event metrics) can be used for evaluating how likely every possible parity syndrome is. The smallest metric error event or error event combination producing a specific parity syndrome value indicates the likelihood of that parity syndrome. Therefore the error event generation system of FIG. 9 and the error processor of FIG. 12 can be used in applications and situations other than those described herein.

Referring now to FIGS. 13A-13G, various exemplary implementations of the present invention are shown.

Figure 13A:
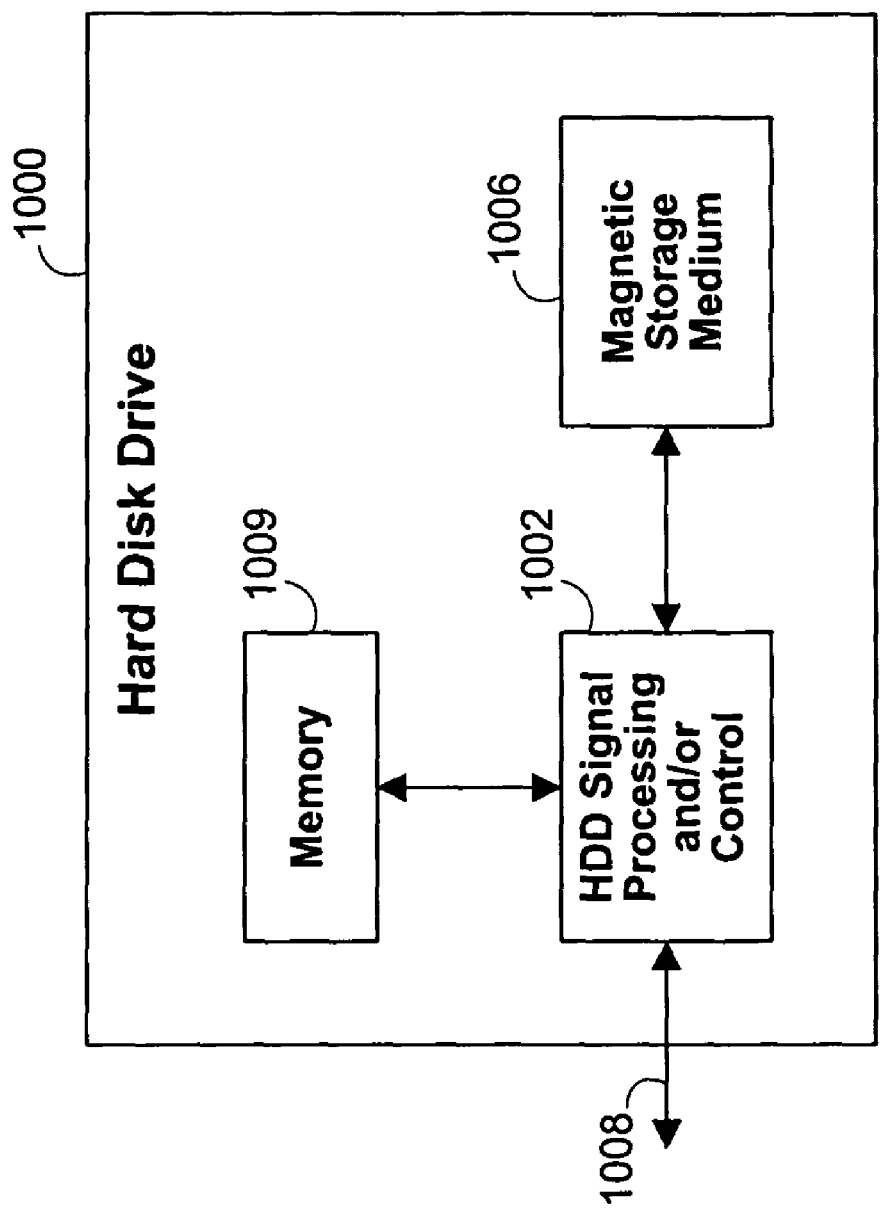
FIG. 13A is a block diagram of an exemplary hard disk drive that can employ the disclosed technology.

Referring now to FIG. 13A, the present invention can be implemented in a hard disk drive 1000.

The present invention may implement either or both signal processing and/or control circuits, which are generally identified in FIG. 13A at 1002. In some implementations, the signal processing and/or control circuit 1002 and/or other circuits (not shown) in the HDD 1000 may process data, perform coding and/or encryption, perform calculations, and/or format data that is output to and/or received from a magnetic storage medium 1006.

The HDD 1000 may communicate with a host device (not shown) such as a computer, mobile computing devices such as personal digital assistants, cellular phones, media or MP3 players and the like, and/or other devices via one or more wired or wireless communication links 1008. The HDD 1000 may be connected to memory 1009 such as random access memory (RAM), low latency nonvolatile memory such as flash memory, read only memory (ROM) and/or other suitable electronic data storage.

Figure 13B:
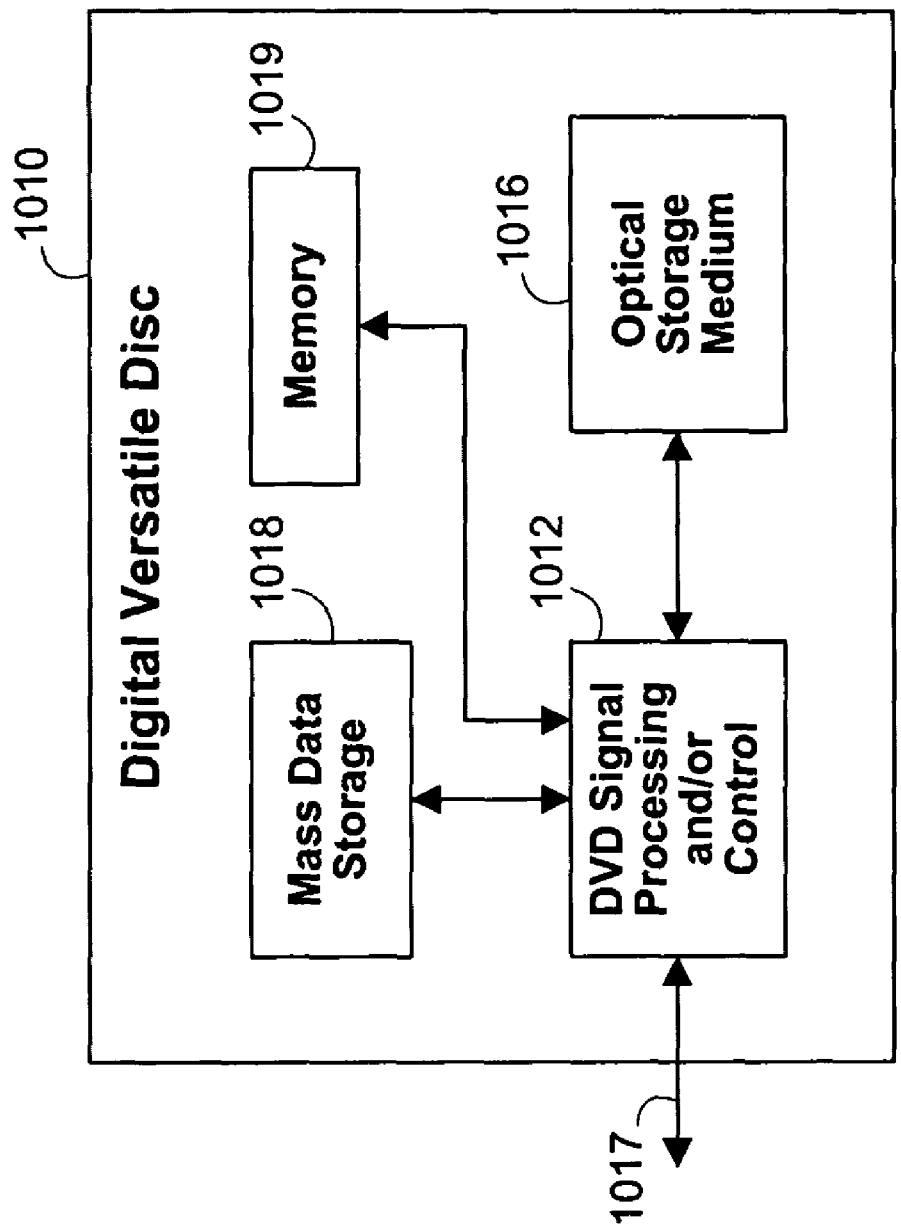
FIG. 13B is a block diagram of an exemplary digital versatile disc that can employ the disclosed technology.

Referring now to FIG. 13B, the present invention can be implemented in a digital versatile disc (DVD) drive 1010. The present invention may implement either or both signal processing and/or control circuits, which are generally identified in FIG. 13B at 1012, and/or mass data storage of the DVD drive 1010. The signal processing and/or control circuit 1012 and/or other circuits (not shown) in the DVD 1010 may process data, perform coding and/or encryption, perform calculations, and/or format data that is read from and/or data written to an optical storage medium 1016. In some implementations, the signal processing and/or control circuit 1012 and/or other circuits (not shown) in the DVD 1010 can also perform other functions such as encoding and/or decoding and/or any other signal processing functions associated with a DVD drive.

The DVD drive 1010 may communicate with an output device (not shown) such as a computer, television or other device via one or more wired or wireless communication links 1017. The DVD 1010 may communicate with mass data storage 1018 that stores data in a nonvolatile manner. The mass data storage 1018 may include a hard disk drive (HDD). The HDD may have the configuration shown in FIG. 13A. The HDD may be a mini HDD that includes one or more platters having a diameter that is smaller than approximately 1.8". The DVD 1010 may be connected to memory 1019 such as RAM, ROM, low latency nonvolatile memory such as flash memory and/or other suitable electronic data storage.

Figure 13C:
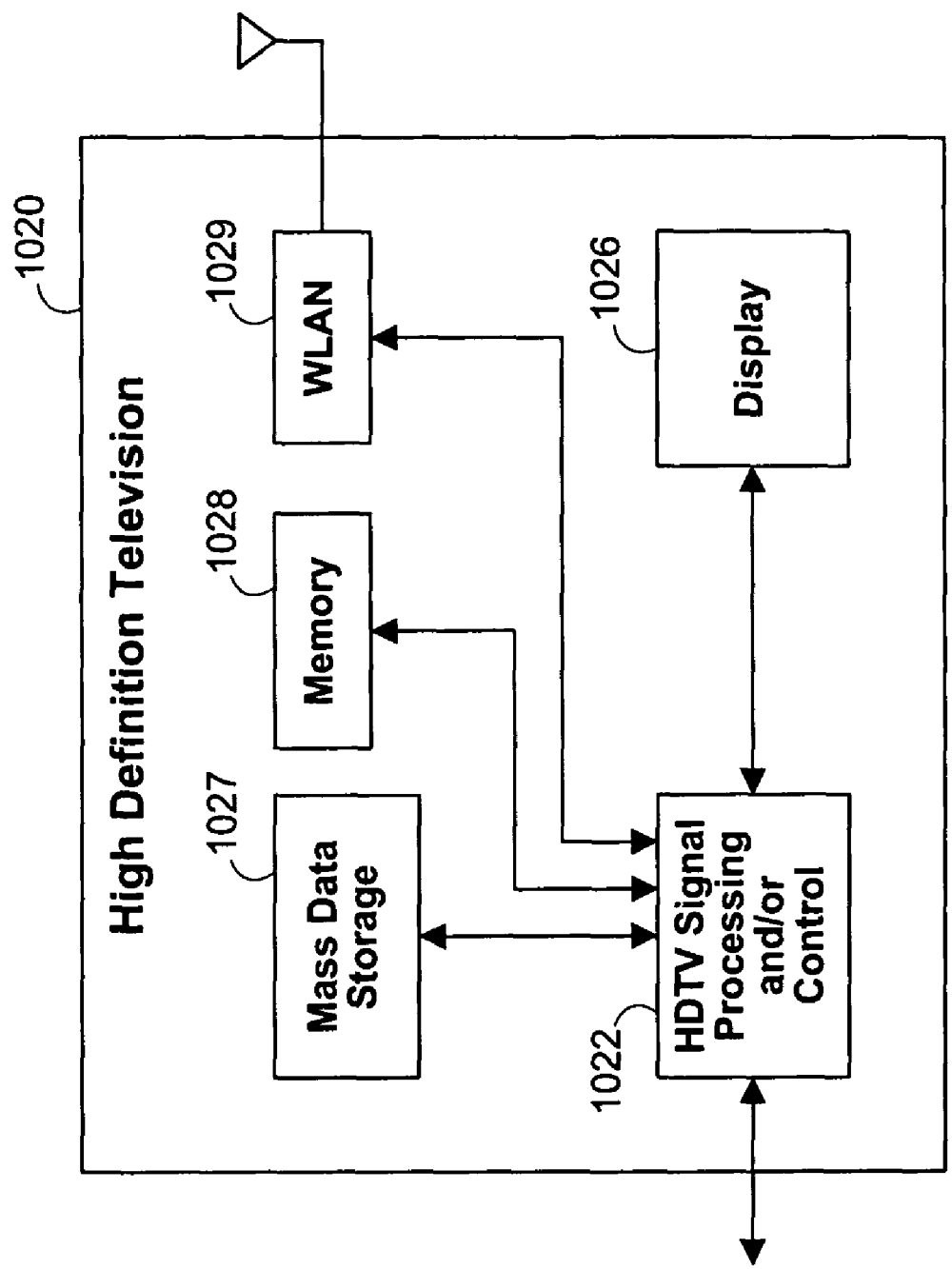
FIG. 13C is a block diagram of an exemplary high definition television that can employ the disclosed technology.

Referring now to FIG. 13C, the present invention can be implemented in a high definition television (HDTV) 1020. The present invention may implement either or both signal processing and/or control circuits, which are generally identified in FIG. 13C at 1022, a WLAN interface and/or mass data storage of the HDTV 1020. The HDTV 1020 receives HDTV input signals in either a wired or wireless format and generates HDTV output signals for a display 1026. In some implementations, signal processing circuit and/or control circuit 1022 and/or other circuits (not shown) of the HDTV 1020 may process data, perform coding and/or encryption, perform calculations, format data and/or perform any other type of HDTV processing that may be required.

The HDTV 1020 may communicate with mass data storage 1027 that stores data in a nonvolatile manner such as optical and/or magnetic storage devices. At least one HDD may have the configuration shown in FIG. 13A and/or at least one DVD may have the configuration shown in FIG. 13B. The HDD may be a mini HDD that includes one or more platters having a diameter that is smaller than approximately 1.8". The HDTV 1020 may be connected to memory 1028 such as RAM, ROM, low latency nonvolatile memory such as flash memory and/or other suitable electronic data storage. The HDTV 1020 also may support connections with a WLAN via a WLAN network interface 1029.

Figure 13D:
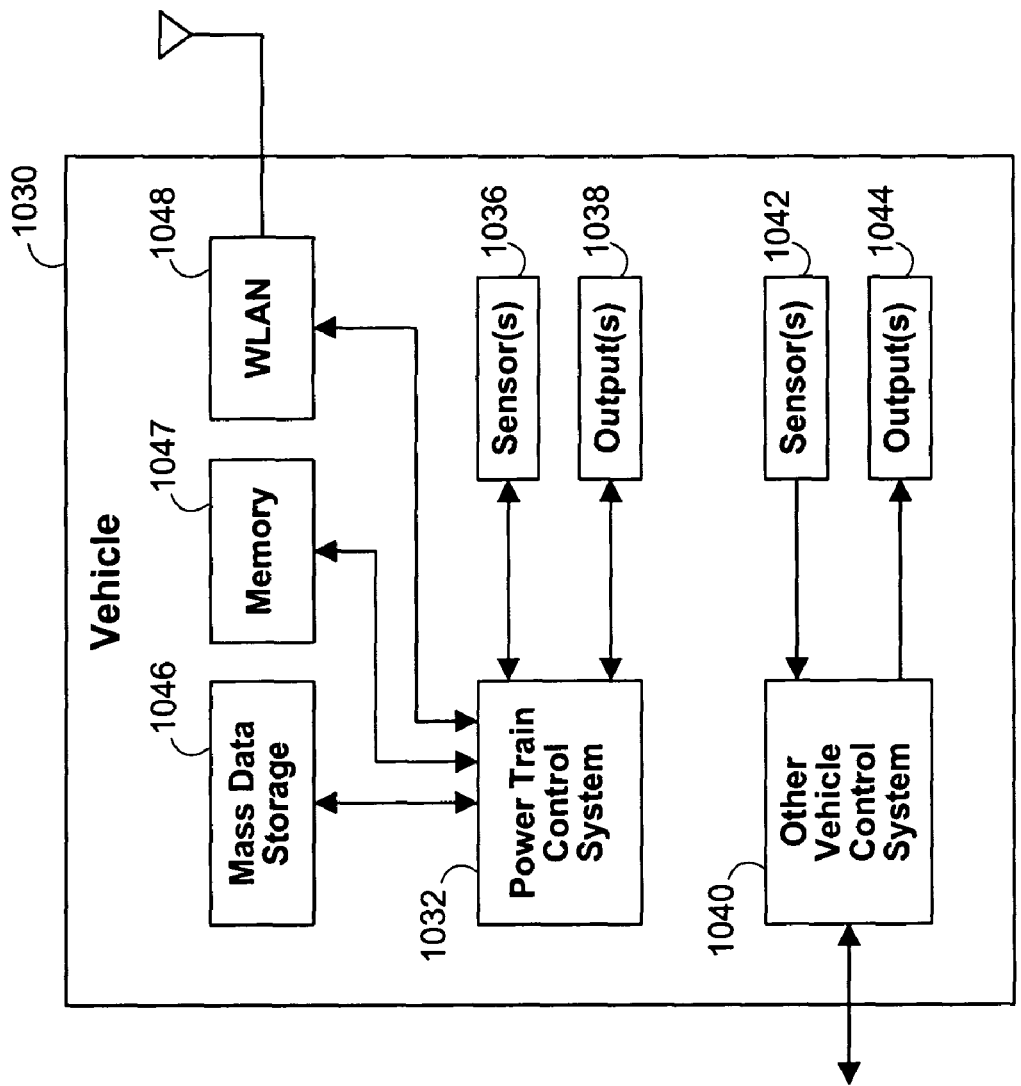
FIG. 13D is a block diagram of an exemplary vehicle that can employ the disclosed technology.

Referring now to FIG. 13D, the present invention implements a control system of a vehicle 1030, a WLAN interface and/or mass data storage of the vehicle control system. In some implementations, the present invention may implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1040 of the vehicle 1030. The control system 1040 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 13E:
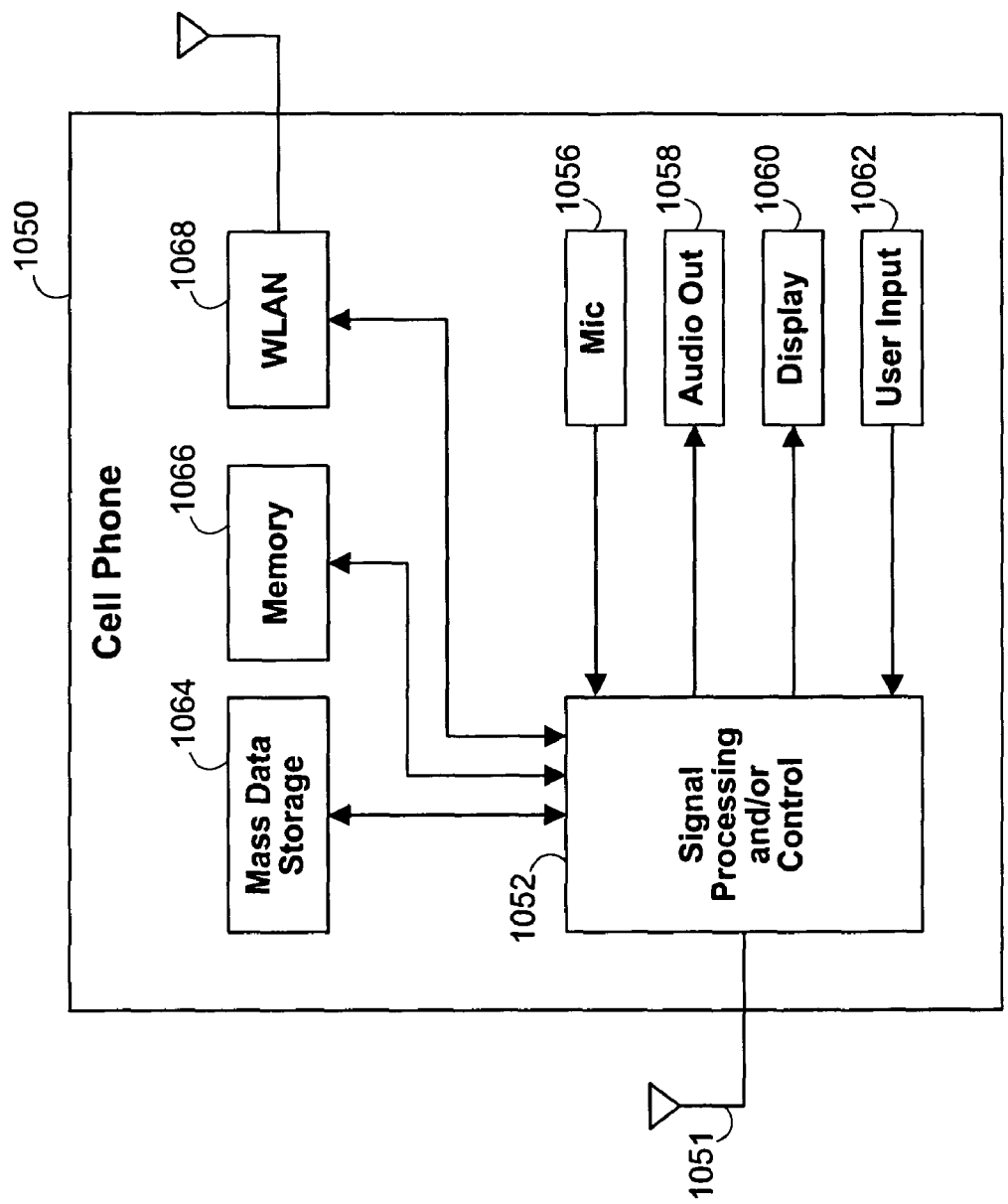
FIG. 13E is a block diagram of an exemplary cell phone that can employ the disclosed technology.

Referring now to FIG. 13E, the present invention can be implemented in a cellular phone 1050 that may include a cellular antenna 1051. The present invention may implement either or both signal processing and/or control circuits, which are generally identified in FIG. 13E at 1052, a WLAN interface and/or mass data storage of the cellular phone 1050. In some implementations, the cellular phone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular phone 1050 may process data, perform coding and/or encryption, perform calculations, format data and/or perform other cellular phone functions.

The cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The cellular phone 1050 may be connected to memory 1066 such as RAM, ROM, low latency nonvolatile memory such as flash memory and/or other suitable electronic data storage. The cellular phone 1050 also may support connections with a WLAN via a WLAN network interface 1068.

Figure 13F:
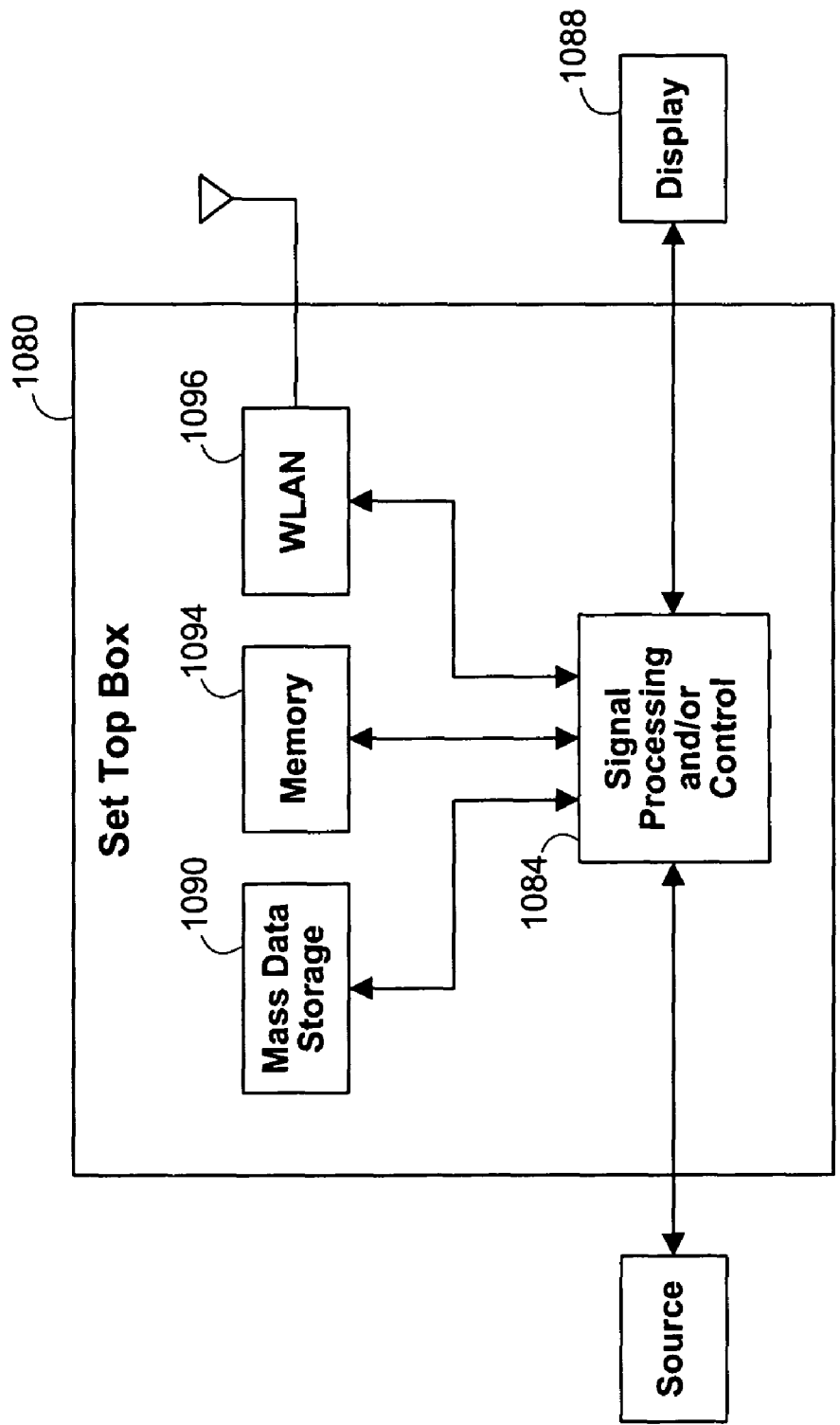
FIG. 13F is a block diagram of an exemplary set top box that can employ the disclosed technology.

Referring now to FIG. 13F, the present invention can be implemented in a set top box 1080. The present invention may implement either or both signal processing and/or control circuits, which are generally identified in FIG. 13F at 1084, a WLAN interface and/or mass data storage of the set top box 1080. The set top box 1080 receives signals from a source such as a broadband source and outputs standard and/or high definition audio/video signals suitable for a display 1088 such as a television and/or monitor and/or other video and/or audio output devices. The signal processing and/or control circuits 1084 and/or other circuits (not shown) of the set top box 1080 may process data, perform coding and/or encryption, perform calculations, format data and/or perform any other set top box function.

The set top box 1080 may communicate with mass data storage 1090 that stores data in a nonvolatile manner. The mass data storage 1090 may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The set top box 1080 may be connected to memory 1094 such as RAM, ROM, low latency nonvolatile memory such as flash memory and/or other suitable electronic data storage. The set top box 1080 also may support connections with a WLAN via a WLAN network interface 1096.

Figure 13G:
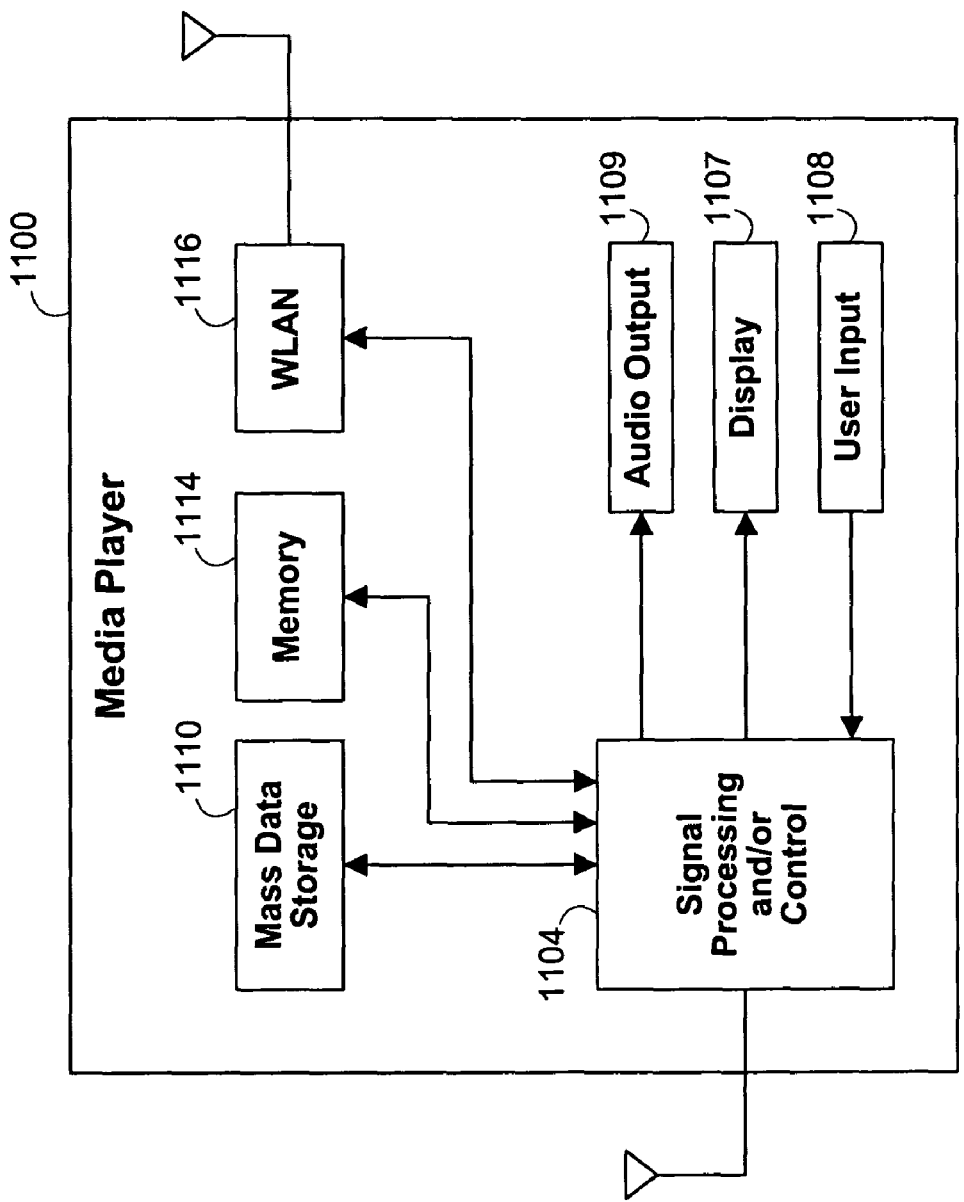
FIG. 13G is a block diagram of an exemplary media player that can employ the disclosed technology.

Referring now to FIG. 13G, the present invention can be implemented in a media player 1100. The present invention may implement either or both signal processing and/or control circuits, which are generally identified in FIG. 13G at 1104, a WLAN interface and/or mass data storage of the media player 1100. In some implementations, the media player 1100 includes a display 1107 and/or a user input 1108 such as a keypad, touchpad and the like. In some implementations, the media player 1100 may employ a graphical user interface (GUI) that typically employs menus, drop down menus, icons and/or a point-and-click interface via the display 1107 and/or user input 1108. The media player 1100 further includes an audio output 1109 such as a speaker and/or audio output jack. The signal processing and/or control circuits 1104 and/or other circuits (not shown) of the media player 1100 may process data, perform coding and/or encryption, perform calculations, format data and/or perform any other media player function.

The media player 1100 may communicate with mass data storage 1110 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The media player 1100 may be connected to memory 1114 such as RAM, ROM, low latency nonvolatile memory such as flash memory and/or other suitable electronic data storage. The media player 1100 also may support connections with a WLAN via a WLAN network interface 1116. Still other implementations in addition to those described above are contemplated.

Accordingly, what have been described thus far are systems and methods for identifying potential error locations, patterns, and likelihoods in connection with trellis-based detection/decoding. The disclosed technology also produces soft information for detected/decoded bits. The disclosed circuits, components, and methods can be implemented using means such as digital circuitry, analog circuitry, and/or a processor architecture with programmable instructions. Additionally, components and/or methods that store information or carry signals can operate based on electrical, optical, and/or magnetic technology, and can include devices such as flip-flops, latches, random access memories, read-only memories, CDs, DVDs, disk drives, or other storage or memory means. The disclosed embodiments and illustrations are exemplary and do not limit the scope of the disclosed technology as defined by the following claims.

What is claimed is:

1. A method for determining potential error patterns, the method comprising:
   detecting information that was previously encoded based on a trellis to provide detected information;
   decoding the detected information based on the trellis to provide decoded information, wherein the decoded information corresponds to a winning path through the trellis that ends at a winning state;
   identifying at least one alternate path through the trellis that ends at the winning state, wherein the at least one alternate path includes a trace back portion and a non-trace back portion;
   determining a trace back depth associated with the trace back portion of the at least one alternate path; and
   generating a potential error pattern based on the winning path and one of the at least one alternate path, wherein said identifying the trace back portion of the at least one alternate path comprises starting from the winning state, tracing back paths through the trellis for a number of trellis stages, wherein the number of trellis stages is based on the trace back depth.

2. The method of claim 1, wherein the winning path reaches the winning state through a first branch connected to the winning state, and wherein said tracing back comprises tracing back through branches other than the first branch.

3. The method of claim 1, further comprising:
   associating each of the at least one alternate path with a metric; and
   eliminating alternate paths whose metrics exceed a threshold value.

4. The method of claim 1, wherein the trellis includes a plurality of states, wherein each state is connected to one winning branch entering the state and at least one losing branch entering the state, the method further comprising:
   eliminating alternate paths that include more than a predetermined number of losing branches.

5. The method of claim 1, wherein the trellis includes a plurality of states, wherein each state is connected to one winning branch entering the state and at least one losing branch entering the state, the method further comprising:
   for one of the plurality of states:
      associating a winning branch entering the state with a metric value of zero; and
      associating a losing branch entering the state with a path metric difference.

6. The method of claim 1, further comprising:
   for each of the at least one alternate path, generating a potential error pattern for the alternate path based on comparing the alternate path with the winning path;
   identifying error pattern of interest from among the potential error pattern; and
   associating a likelihood metric with each of the error patterns of interest.

7. The method of claim 6, wherein the likelihood metric is based on path metric differences.

8. The method of claim 1, wherein the trace back depth is associated with a predetermined number of the at least one alternate path, further comprising:
   identifying a boundary stage in the trellis by tracing back, starting from the winning state, a number of trellis stages based on the trace back depth, wherein the boundary stage includes a plurality of trellis states.

9. The method of claim 8, further comprising:
for each of the trellis states in the boundary stage:
- determining a winning path from an initial state in the trellis to the trellis state;
- determining user information corresponding to the winning path;
- computing a difference between the user information and a non-trace back portion of the decoded information;
- storing the difference in a path memory; and
- associating the difference with the trellis state.

10. The method of claim 9, further comprising:
for each of the trellis states in the boundary stage:
- computing a SPC syndrome based on the difference;
- storing the SPC syndrome in a memory; and
- associating the SPC syndrome with the trellis state.

11. The method of claim 10, wherein said generating a potential error pattern based on the winning path and one of the alternate paths comprises:
- determining the particular trellis state in the boundary stage that is in the one alternate path;
- providing a non-trace back portion of potential error pattern by retrieving from the memory the difference associated with the particular trellis state;
- determining user information for a trace back portion of the one alternate path; and
- generating a trace back portion of the potential error pattern by computing a difference between a trace back portion of the decoded information and the user information corresponding to the trace back portion of the one alternate path.

12. The method of claim 11, further comprising:
- computing a first SPC syndrome based on the decoded information;
- retrieving from the memory the SPC syndrome associated with the particular trellis state to provide a retrieved SPC syndrome;
- computing a second SPC syndrome based on the retrieved SPC syndrome and the trace back portion of the potential error pattern; and
- if the first and second SPC syndromes are both odd, altering the decoded information based on the potential error pattern.

13. The method of claim 8, further comprising:
for each of the trellis states in the boundary stage:
- determining the winning path from an initial state in the trellis to the trellis state;
- determining user information corresponding to the winning path;
- storing the user information in a memory; and
- associating the user information with the trellis state.

14. The method of claim 13, wherein said generating a potential error pattern based on the winning path and one of the alternate paths comprises:
- determining user information corresponding to the one alternate path by:
  - determining a particular trellis state in the boundary stage that is in the one alternate path;
  - providing user information corresponding to a non-trace back portion of the one alternate path by retrieving from the memory user information corresponding to the particular trellis state; and
  - determining user information corresponding to a trace back portion of the one alternate path; and
- generating the potential error pattern by computing a difference between the decoded information and the user information corresponding to the one alternate path.

15. The method of claim 14, further comprising:
- computing a first single parity check (SPC) syndrome based on the decoded information;
- computing a second SPC syndrome based on the potential error pattern; and
- if the first and second SPC syndromes are both odd, altering the decoded information based on the potential error pattern.

16. The method of claim 15 further comprising:
- generating a plurality of potential error patterns by computing a difference between the decoded information and user information corresponding to a plurality of alternate paths;
- calculating metric values for each of the plurality of potential error patterns;
- computing the second SPC syndrome for each of the plurality of potential error patterns; and
- selecting one of the potential error patterns having a smallest metric value and having an odd second SPC syndrome among the plurality of potential error patterns.

17. The method of claim 14, further comprising:
- computing a first multiple-bit parity syndrome based on the decoded information;
- generating a plurality of potential error patterns by computing a difference between the decoded information and user information corresponding to a plurality of alternate paths;
- calculating metric values for each of the plurality of potential error patterns;
- computing a plurality of second multiple-bit parity syndromes based on the plurality of potential error patterns;
- selecting one of the potential error patterns, wherein the selected potential error pattern has a smallest metric value among the plurality of potential error patterns and wherein one of the second multiple-bit parity syndromes computed based on the selected potential error pattern matches the first multiple-bit parity syndrome; and
- altering the decoded information based on the selected potential error pattern.

18. The method of claim 17, further comprising:
- combining two or more of the plurality of potential error patterns to form one or more combined potential error patterns;
- calculating combined metric values for each of the one or more combined potential error patterns;
- computing one or more combined multiple-bit parity syndromes based on the one or more combined potential error patterns; and
- selecting one of the combined potential error patterns to alter the decoded information.

19. A system for determining potential error patterns, the system comprising:
- a detector that detects information that was previously encoded based on a trellis to provide detected information;
- a decoder that decodes the detected information based on the trellis to provide decoded information, wherein the decoded information corresponds to a winning path through the trellis that ends at a winning state; and
- an error event generator that is configured to:
  - identify at least one alternate path through the trellis that ends at the winning state, wherein the at least one alternate path includes a trace back portion and a non-trace back portion;
  - determine a trace back depth associated with the trace back portion of the at least one alternate path;

trace back paths through the trellis, starting from the winning state, for a number of trellis stages, wherein the number of trellis stages is based on the trace back depth; and generate potential error pattern based on the winning path and one of the at least one alternate path.

20. The system of claim 19 wherein the winning path reaches the winning state through a first branch connected to the winning state, and wherein said tracing back comprises tracing back through branches other than the first branch.

21. The system of claim 19, wherein the error event generator is further configured to:

associate each of the at least one alternate path with a metric; and eliminate alternate paths whose metrics exceed a threshold value.

22. The system of claim 19, wherein the trellis includes a plurality of states, wherein each state is connected to one winning branch entering the state and at least one losing branch entering the state, wherein the error event generator is further configured to eliminate alternate paths that include more than a predetermined number of losing branches.

23. The system of claim 19, wherein the trellis includes a plurality of states, wherein each state is connected to one winning branch entering the state and at least one losing branch entering the state, wherein the decoder is further configured to associate a winning branch entering a state with a metric value of zero and associate a losing branch entering a state with a path metric difference.

24. The system of claim 19, wherein the error event processor is further configured to:

generate potential error patterns for the alternate paths based on comparing the alternate paths with the winning path;

identify error patterns of interest from among the potential error patterns; and associate a likelihood metric with each of the error patterns of interest.

25. The system of claim 24, wherein the likelihood metric is based on path metric differences.

26. The system of claim 19, wherein the trace back depth is associated with a predetermined number of the alternate paths, and wherein the decoder is further configured to:

identify a boundary stage in the trellis by tracing back, starting from the winning state, a number of trellis stages based on the trace back depth, wherein the boundary stage includes a plurality of trellis states.

27. The system of claim 26, further comprising a memory, wherein the error event generator is further configured to:

determine a winning path from an initial state in the trellis to a trellis state in the boundary stage;

determine user information corresponding to the winning path;

compute a difference between the user information and a non-trace back portion of the decoded information;

store the difference in the memory; and associate the difference with the trellis state.

28. The system of claim 27, wherein the error event generator is further configured to:

compute a SPC syndrome based on the difference;

store the SPC syndrome in the memory; and associate the SPC syndrome with the trellis state.

29. The system of claim 28, wherein the error event generator is further configured to:

determine the particular trellis state in the boundary trellis stage that is in the one alternate path; and provide a non-trace back portion of potential error pattern by retrieving from the memory the difference associated with the particular trellis state;

determine user information for a trace back portion of the one alternate path; and generate a trace back portion of the potential error pattern by computing a difference between a trace back portion of the decoded information and the user information corresponding to the trace back portion of the one alternate path.

30. The system of claim 29, wherein the error event generator is further configured to:

compute a first SPC syndrome based on the decoded information;

retrieve from the memory the SPC syndrome associated with the particular trellis state to provide a retrieved SPC syndrome;

compute a second SPC syndrome based on the retrieved SPC syndrome and the trace back portion of the potential error pattern; and alter the decoded information based on the potential error pattern if the first and second SPC syndromes are both odd.

31. The system of claim 26, further comprising a memory, wherein the decoder is further configured to:

determine a winning path from an initial state in the trellis to a trellis state in the boundary stage;

determine user information corresponding to the winning path;

store the user information in the memory; and associate the user information with the trellis state.

32. The system of claim 31, wherein the error event generator is further configured to:

determine a particular trellis state in the boundary stage that is in the one alternate path;

provide user information corresponding to a non-trace back portion of the one alternate path by retrieving from the memory the user information corresponding to the particular trellis state; and determine user information corresponding to a trace back portion of the one alternate path; and generate the potential error pattern by computing a difference between the decoded information and the user information corresponding to the one alternate path.

33. The system of claim 32, wherein the error event generator is further configured to:

compute a first single parity check (SPC) syndrome based on the decoded information;

compute a second SPC syndrome based on the potential error pattern; and alter the decoded information based on the potential error pattern if the first and second SPC syndromes are both odd.

34. The system of claim 32 wherein the error event generator is further configured to:

generate a plurality of potential error patterns by computing a difference between the decoded information and user information corresponding to a plurality of alternate paths;

calculate metric values for each of the plurality of potential error patterns;

computing the second SPC syndrome for each of the plurality of potential error patterns; and selecting one of the potential error patterns having a smallest metric value and having an odd second SPC syndrome among the plurality of potential error patterns.

35. The system of claim 32, wherein the error event generator is further configured to:

compute a first multiple-bit parity syndrome based on the decoded information;

generate a plurality of potential error patterns by computing a difference between the decoded information and user information corresponding to a plurality of alternate paths;

calculate metric values for each of the plurality of potential error patterns;

compute a plurality of second multiple-bit parity syndromes based on the plurality of potential error patterns;

select one of the potential error patterns, wherein the selected potential error pattern has a smallest metric value among the plurality of potential error patterns and wherein one of the second multiple-bit parity syndromes computed based on the selected potential error pattern matches the first multiple-bit parity syndrome; and alter the decoded information based on the selected potential error pattern.

36. The system of claim 35, wherein the error event generator is further configured to:

combine two or more of the plurality of potential error patterns to form one or more combined potential error patterns;

calculate combined metric values for each of the one or more combined potential error patterns;

compute one or more combined multiple-bit parity syndromes based on the one or more combined potential error patterns; and select one of the combined potential error patterns to alter the decoded information.

* * * * *